United States Patent
Omori et al.

(10) Patent No.: US 8,492,808 B2
(45) Date of Patent: Jul. 23, 2013

(54) SEMICONDUCTOR DEVICE AND MANUFACTURING METHOD THEREOF

(75) Inventors: Kazuyuki Omori, Kanagawa (JP); Kenichi Mori, Kanagawa (JP); Naohito Suzumura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 188 days.

(21) Appl. No.: 13/181,742

(22) Filed: Jul. 13, 2011

(65) Prior Publication Data

US 2012/0043630 A1 Feb. 23, 2012

(30) Foreign Application Priority Data

Aug. 19, 2010 (JP) ................................. 2010-183946

(51) Int. Cl.
*H01L 27/22* (2006.01)
*H01L 43/08* (2006.01)
*H01L 23/522* (2006.01)
*H01L 23/532* (2006.01)

(52) U.S. Cl.
CPC ............. *H01L 27/228* (2013.01); *H01L 43/08* (2013.01); *H01L 23/5226* (2013.01); *H01L 23/53233* (2013.01); *H01L 23/53238* (2013.01)
USPC ........... 257/295; 257/751; 257/758; 257/761; 257/762; 257/763; 438/3; 438/627; 438/629; 438/639; 438/643; 438/653; 438/656; 438/672; 438/687; 365/158; 365/176

(58) Field of Classification Search
USPC .............. 257/298, 300, 350; 438/3, 197, 489; 365/158, 173
See application file for complete search history.

(56) References Cited

U.S. PATENT DOCUMENTS

| 7,088,610 | B2 | 8/2006 | Tai |
| 2005/0009210 | A1* | 1/2005 | Hosotani ........................ 438/3 |
| 2005/0030821 | A1 | 2/2005 | Tai |
| 2008/0197496 | A1 | 8/2008 | Mori et al. |

FOREIGN PATENT DOCUMENTS

| JP | 2004-363411 | 12/2004 |
| JP | 2005-294723 | 10/2005 |
| JP | 2008-205119 | 9/2008 |

* cited by examiner

*Primary Examiner* — Olik Chaudhuri
*Assistant Examiner* — Wilner Jean Baptiste
(74) *Attorney, Agent, or Firm* — McDermott Will & Emery LLP

(57) ABSTRACT

In MRAM, a write wiring clad in a ferromagnetic film has been used to reduce a write current or avoid disturbances. Besides, a CuAl wiring obtained by adding a trace of Al to a Cu wiring has been used widely to secure reliability of a high reliability product. There is a high possibility of MRAM being mounted in high reliability products so that reliability is important. Clad wiring however increases the resistance of the CuAl wiring, which is originally high, so that using both may fail to satisfy the specification of the wiring resistance. In the semiconductor device of the invention having plural copper-embedded wiring layers, copper wiring films of plural copper-embedded clad wirings configuring a memory cell matrix region of MRAM are made of relatively pure copper, while a CuAl wiring film is used as copper wiring films of copper-embedded non-clad wirings below these wiring layers.

20 Claims, 32 Drawing Sheets

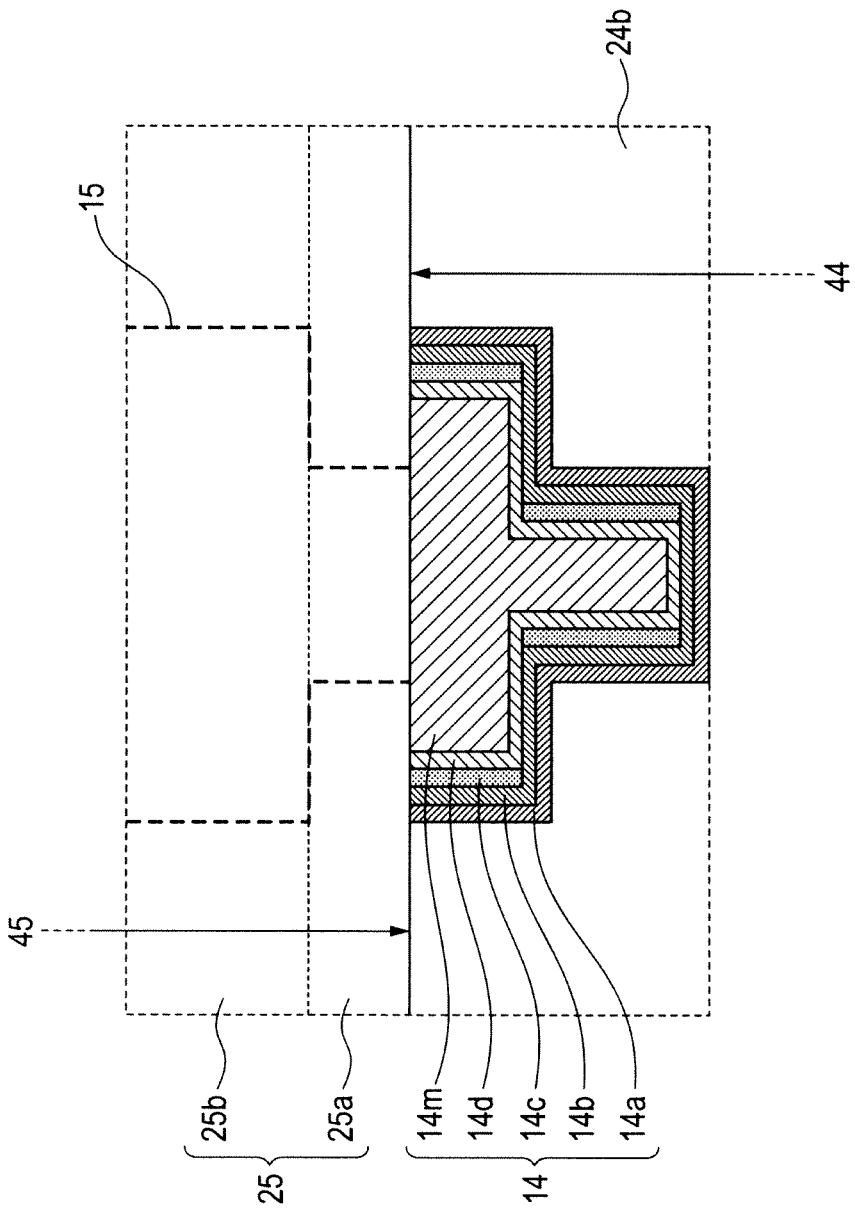

SEMICONDUCTOR DEVICE AND MANUFACTURING METHOD THEREOF

CROSS-REFERENCE TO RELATED APPLICATIONS

The disclosure of Japanese Patent Application No. 2010-183946 filed on Aug. 19, 2010 including the specification, drawings and abstract is incorporated herein by reference in its entirety.

BACKGROUND

The present invention relates to a device structure of a semiconductor device (or semiconductor integrated circuit device) or a technology effective when applied to a memory structure and a wiring technology in the manufacturing method of a semiconductor device (or a semiconductor integrated circuit device).

Japanese Patent Laid-Open No. 2004-363411 (Patent Document 1) and U.S. Patent Laid-Open No. 2005-30821 (Patent Document 2) corresponding thereto disclose a technology of providing, in a semiconductor integrated circuit device having an MRAM (magnetic random access memory) cell portion and a peripheral circuit, a clad layer only for a write word line adjacent to the lower portion of an MTJ (magnetic tunnel junction) element of the MRAM cell portion and thereby preventing wiring layers from becoming complex in the peripheral circuit.

Japanese Patent Laid-Open No. 2005-294723 (Patent Document 3) discloses a technology of, in a semiconductor integrated circuit device having an MRAM cell portion and a peripheral circuit, providing a structure in which only a lower-level wiring configuring a write word line and a bit line adjacent to the top and bottom of an MTJ element in the MRAM cell portion has a clad layer and using wirings located above them in the peripheral circuit, thereby preventing the wiring layers from becoming complex in the peripheral circuit.

Japanese Patent Laid-Open No. 2008-205119 (Patent Document 4) or U.S. Patent Laid-Open No. 2008-197496 (Patent Document 5) corresponding thereto discloses a copper-embedded wiring added with aluminum or the like as a measure against EM (electromigration) and SM (stress migration).

PATENT DOCUMENTS

[Patent Document 1] Japanese Patent Laid-Open No. 2004-363411
[Patent Document 2] U.S. Patent Laid-Open No. 2005-30821
[Patent Document 3] Japanese Patent Laid-Open No. 2005-294723
[Patent Document 4] Japanese Patent Laid-Open No. 2008-205119
[Patent Document 5] U.S. Patent Laid-Open No. 2008-197496

SUMMARY

In MARM, a "clad wiring structure" in which a wiring used for writing is clad in a ferromagnetic film in order to reduce a write current or prevent disturbance of adjacent cells has been used popularly. The inventors of the invention have so far developed a clad wiring structure using an NiFe alloy which is a ferromagnetic film in order to improve the performance of MRAM. Since a wiring layer using a clad wiring may be employed not only in a memory cell but also in a peripheral circuit, it should satisfy, in addition to the improvement in the performance of MRAM, basic properties of a wiring such as resistance and reliability. An EM test was made using a clad wiring structure and an usual Cu wiring. As a result, it has revealed that the estimated life of the clad wiring showed improvement of about 10 times of the estimated life of the usual Cu wiring in the test of wiring EM and lower-level thin-wire via EM. CuAl wirings obtained by adding a trace of Al to a Cu wiring has been used widely in order to ensure the reliability of high-reliability products such as those to be mounted in automotives. Judging from the high possibility of MRAM being mounted in automotives, the reliability is an important factor for it.

Investigation by the present inventors has however revealed that the clad wiring has a disadvantage of further increasing the wiring resistance of the CuAl wiring which is originally high so that simultaneous use of both technologies may fail to satisfy a desired wiring resistance.

The invention has been made with a view to overcoming these problems.

An object of the invention is to provide a semiconductor device with high reliability.

The above-described and the other objects and novel features of the invention will be apparent from the description herein and accompanying drawings.

The typical invention, among the inventions disclosed herein, will next be outlined briefly.

In one aspect of the invention, there is provided a semiconductor device having a plurality of copper-embedded wiring layers, in which a copper wiring film of a plurality of copper-embedded clad wirings configuring an MRAM memory cell matrix region is made of relatively pure copper and a CuAl wiring film, that is, a Cu wiring film added with Al is used as a copper wiring film of copper-embedded non-clad wiring layers below the above-described wiring layers.

Advantages available by the typical invention disclosed herein will next be described briefly.

In a semiconductor device having a plurality of copper-embedded wiring layers, a copper wiring film of a plurality of copper-embedded clad wiring layers configuring an MRAM memory cell matrix region is made of relatively pure copper and a CuAl wiring film, that is, a Cu wiring added with Al is used as a copper wiring film of copper-embedded non-clad wiring layers below the above-described wiring layers so that it is possible to prevent an excessive increase in wiring resistance while ensuring EM resistance.

BRIEF DESCRIPTION OF THE DRAWINGS

FIG. 32 is an enlarged cross-sectional view around the M4 wiring (third wiring) 14 corresponding to the cross-sectional enlarged view D around the wiring of a non-memory cell matrix region formed in the same layer as the bit line of FIG. 5 (FIG. 23).

DETAILED DESCRIPTION

Figure 1:
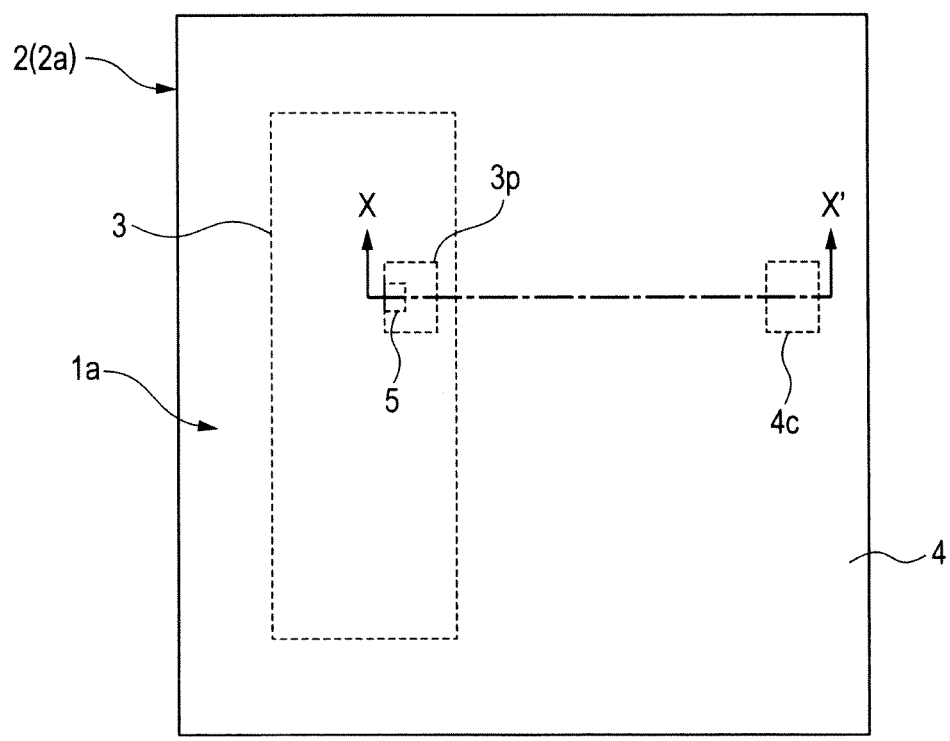
FIG. 1 is a top surface layout of a semiconductor chip corresponding to a semiconductor device according to a first embodiment of the invention.

Outline of Modes for Carrying Out the Invention

First, typical modes for carrying out the invention disclosed herein will be outlined.

1. A semiconductor device includes: (a) a semiconductor substrate having a first main surface and a second main surface; (b) an MISFET provided over the first main surface of the semiconductor substrate; (c) a first interlayer insulating film covering therewith the first main surface of the semiconductor substrate and the MISFET; (d) a first wiring layer provided over the first interlayer insulating film; (e) a second wiring layer provided over the first wiring layer; and (f) a third wiring layer provided over the second wiring layer. Here, the first wiring layer includes: (d1) a second interlayer insulating film, (d2) a first wiring trench formed in the second interlayer insulating film, (d3) a first barrier metal film formed over the side surface and the bottom surface of the first wiring trench and containing at least one of tantalum, titanium, ruthenium, manganese, and tungsten as one of the main metal components of the first barrier metal film, and (d4) a first copper wiring film formed over the first barrier metal film to embed the first wiring trench, configuring a first wiring together with the first barrier metal film, and containing an additive element. The second wiring layer includes: (e1) a third interlayer insulating film: (e2) a second wiring trench formed in the third interlayer insulating film, (e3) a second barrier metal film formed over the side surface and the bottom surface of the second wiring trench and containing at least one of tantalum, titanium, ruthenium, manganese, and tungsten as one of the main metal components of the second barrier metal film, (e4) a third barrier metal film formed over the second barrier metal film and containing at least one of cobalt, nickel, and iron as one of the main metal components of the third barrier metal film, and (e5) a second copper wiring film formed over the third barrier metal film to embed the second wiring trench, configuring a second wiring together with the second and third barrier metal films, and comprised of pure copper. The third wiring layer includes: (f1) a magnetic memory element.

2. In the semiconductor device as described above in 1, the additive element is at least any one of aluminum, germanium, gallium, manganese, silicon, titanium, and tin.

3. In the semiconductor device as described above in 1 or 2, recording of data in the magnetic memory element is effected by passing an electric current through the second wiring.

4. In the semiconductor device as described in any one of 1 to 3, the third wiring layer further includes: (f2) a fourth interlayer insulating film having the magnetic memory element provided therein; (f3) a third wiring trench formed in the third interlayer insulating film, located above the magnetic memory element, and extending in a direction perpendicular to the second wiring trench; (f4) a fourth barrier metal film formed over the side surface and the bottom surface of the third wiring trench and containing at least one of tantalum, titanium, ruthenium, manganese, and tungsten as one of the main metal components of the fourth barrier metal film; (f5) a fifth barrier metal film formed over the fourth barrier metal film and containing at least one of cobalt, nickel, and iron as one of the main components of the fifth barrier metal film; and (f6) a third copper wiring film formed over the fifth barrier metal film to embed the third wiring trench, configuring a third wiring together with the fourth and fifth barrier metal films, and comprised of pure copper.

5. In the semiconductor device as described above in any one of 1 to 4, the magnetic memory element is a magnetic tunnel junction type magnetic memory element.

6. In the semiconductor device as described above in any one of 1 to 5, the first wiring layer and the second wiring layer have, even in a non-memory cell matrix region outside the memory cell matrix region in which the magnetic memory elements have been arranged in a matrix form, substantially similar structures to those in the memory cell matrix region, respectively.

7. The semiconductor device as described above in any one of 1 to 6, further includes: (g) a fourth wiring layer formed over the third wiring layer and having a substantially similar structure to that of the first wiring layer.

8. The semiconductor device as described above in any one of 1 to 7, further includes: (h) a fifth wiring layer formed over the fourth wiring layer and having a substantially similar structure to that of the first wiring layer except that the additive element has not been added.

9. The semiconductor device as described above in any one of 1 to 8, further includes: (i) a copper-penetrating via which penetrates through the semiconductor substrate from the first main surface to the second main surface and is comprised of pure copper.

10. A semiconductor device includes: (a) semiconductor substrate having a first main surface and a second main surface; (b) an MISFET provided over the first main surface of the semiconductor substrate; (c) a first interlayer insulating film covering therewith the first main surface of the semiconductor substrate and the MISFET; (d) a first wiring layer provided over the first interlayer insulating film; (e) a second wiring layer provided over the first wiring layer; and (f) a third wiring layer provided over the second wiring layer. The first wiring layer includes: (d1) a second interlayer insulating film, (d2) a first wiring trench formed in the second interlayer insulating film, (d3) a first barrier metal film formed over the side surface and the bottom surface of the first wiring trench and containing at least one of tantalum, titanium, ruthenium, manganese, and tungsten as one of the main metal components of the first barrier metal film, and (d4) a first copper wiring film formed over the first barrier metal film to embed the first wiring trench and configuring a first wiring together with the first barrier metal film. The second wiring layer includes: (e1) a third interlayer insulating film: (e2) a second wiring trench formed in the third interlayer insulating film, (e3) a second barrier metal film formed over the side surface and the bottom surface of the second wiring trench and containing at least one of tantalum, titanium, ruthenium, manganese, and tungsten as one of the main metal components of the second barrier metal film, (e4) a third barrier metal film formed over the second barrier metal film and containing at least one of cobalt, nickel, and iron as one of the main components of the third barrier metal film, and (e5) a second copper wiring film formed over the third barrier metal film to embed the second wiring trench and configuring a second wiring together with the second and third barrier metal films. The third wiring layer includes: (f1) a magnetic memory element. The first copper ing film contains an additive element and the content thereof is higher than the content of the additive element in the second copper wiring film.

11. In the semiconductor device as described above in 10, the additive element is at least any one of aluminum, germanium, gallium, manganese, silicon, titanium, and tin.

12. In the semiconductor device as described above in 10 or 11, recording of data in the magnetic memory element is effected by passing an electric current through the second wiring.

13. In the semiconductor device as described above in any one of 10 to 12, the third wiring layer further includes: (f2) a fourth interlayer insulating film having the magnetic memory element provided therein; (f3) a third wiring trench formed in the third interlayer insulating film, located above the magnetic memory element and extending in a direction perpendicular to the second wiring trench; (f4) a fourth barrier metal film formed over the side surface and the bottom surface of the third wiring trench and containing at least one of tantalum, titanium, ruthenium, manganese, and tungsten as one of the main metal components of the fourth barrier metal film; (f5) a fifth barrier metal film formed over the fourth barrier metal film and containing at least one of cobalt, nickel, and iron as one of the main components of the fifth barrier metal film; and (f6) a third copper wiring film formed over the fifth barrier metal film to embed the third wiring trench, configuring the third wiring together with the fourth and fifth barrier metal films, and comprised of pure copper.

14. In the semiconductor device as described above in any one of 10 to 13, the magnetic memory element is a magnetic tunnel junction type magnetic memory element.

15. In the semiconductor device as described above in any one of 10 to 14, the first wiring layer and the second wiring layer have, even in a non-memory cell matrix region located outside of the memory cell matrix region in which the magnetic memory elements have been arranged in a matrix form, substantially similar structures to those in the memory cell matrix region, respectively.

16. The semiconductor device as described above in any one of 10 to 15, further includes: (g) a fourth wiring layer formed over the third wiring layer and having a substantially similar structure to that of the first wiring layer.

17. The semiconductor device as described above in any one of 10 to 16, further includes: (h) a fifth wiring layer formed over the third wiring layer and having a substantially similar structure to that of the first wiring layer except that the additive element has not been added.

18. The semiconductor device as described above in any of 10 to 17, further includes: (i) a copper-penetrating via which penetrates through the semiconductor substrate from the first main surface to the second main surface and is comprised of pure copper.

19. A method for manufacturing a semiconductor device, includes the following steps of: (a) forming an MISFET over a first main surface of a semiconductor substrate having the first main surface and a second main surface; (b) forming a first interlayer insulating film to cover the first main surface of the semiconductor substrate and the MISFET; (c) forming a first wiring layer over the first interlayer insulating film; (d) forming a second wiring layer over the first wiring layer; and (e) forming a third wiring layer over the second wiring layer. The first wiring layer includes: (d1) a second interlayer insulating film, (d2) a first wiring trench formed in the second interlayer insulating film, (d3) a first barrier metal film formed over the side surface and the bottom surface of the first wiring trench and containing at least one of tantalum, titanium, ruthenium, manganese, and tungsten as one of the main metal components of the first barrier metal film, and (d4) a first copper wiring film formed over the first barrier metal film to embed the first wiring trench, configuring a first wiring together with the first barrier metal film, and containing an additive element. The second wiring layer includes: (e1) a third interlayer insulating film; (e2) a second wiring trench formed in the third interlayer insulating film, (e3) a second barrier metal film formed over the side surface and the bottom surface of the second wiring trench and containing at least one of tantalum, titanium, ruthenium, manganese, and tungsten as one of the main metal components of the second barrier metal film, (e4) a third barrier metal film formed over the second barrier metal film and containing at least one of cobalt, nickel, and iron as one of the main components of the third barrier metal film, and (e5) a second copper wiring film formed over the third barrier metal film to embed the second wiring trench, configuring the second wiring together with the second and third barrier metal films, and composed of pure copper. The third wiring layer includes: (f1) a magnetic memory element.

20. In the method for manufacturing a semiconductor device as described above in 19, the additive element is at least any one of aluminum, germanium, gallium, manganese, silicon, titanium, and tin.

21. In the method for manufacturing a semiconductor device as described above in 19 or 20, recording of data in the magnetic memory element is effected by passing an electric current through the second wiring.

22. In the method for manufacturing a semiconductor device as described in any one of 19 to 21, the third wiring layer further includes: (f2) a fourth interlayer insulating film having the magnetic memory element provided therein; (f3) a third wiring trench formed in the third interlayer insulating film, located above the magnetic memory element, and extending in a direction perpendicular to the second wiring trench; (f4) a fourth barrier metal film formed over the side surface and the bottom surface of the third wiring trench and containing at least one of tantalum, titanium, ruthenium, manganese, and tungsten as one of the main metal components of the fourth barrier metal film; (f5) a fifth barrier metal film formed over the fourth barrier metal film and containing at least one of cobalt, nickel, and iron as one of the main components of the fifth barrier metal film; and (f6) a third copper wiring film formed over the fifth barrier metal film to embed the third wiring trench, configuring a third wiring together with the fourth and fifth barrier metal films, and comprised of pure copper.

23. In the method for manufacturing a semiconductor device as described above in any one of 19 to 22, the magnetic memory element is a magnetic tunnel junction type magnetic memory element.

24. In the method for manufacturing a semiconductor device as described above in any one of 19 to 23, the first wiring layer and the second wiring layer have, even in a non-memory cell matrix region located outside of the memory cell matrix region in which the magnetic memory elements have been arranged in a matrix form, have substantially similar structures to those in the memory cell matrix region, respectively.

25. In the method for manufacturing a semiconductor device as described above in any one of 19 to 24, the semiconductor device further includes: (g) a fourth wiring layer formed over the third wiring layer and having a substantially similar structure to that of the second wiring layer.

26. In the method for manufacturing a semiconductor device as described above in any one of 19 to 25, the semiconductor device further includes: (h) a fifth wiring layer formed over the third wiring layer and having a substantially similar structure to that of the first wiring layer.

27. In the method for manufacturing a semiconductor device as described above in any one of 19 to 26, the semiconductor device further includes: (i) a copper-penetrating via which penetrates through the semiconductor substrate from the first main surface to the second main surface and is comprised of pure copper.

28. A method for manufacturing a semiconductor device, includes the following steps of: (a) forming an MISFET over a first main surface of a semiconductor substrate having the first main surface and a second main surface; (b) forming a first interlayer insulating film to cover the first main surface of the semiconductor substrate and the MISFET; (c) forming a first wiring layer over the first interlayer insulating film; (d) forming a second wiring layer over the first wiring layer; and (e) forming a third wiring layer over the second wiring layer. The first wiring layer includes: (d1) a second interlayer insulating film, (d2) a first wiring trench formed in the second interlayer insulating film, (d3) a first barrier metal film formed over the side surface and the bottom surface of the first wiring trench and containing at least one of tantalum, titanium, ruthenium, manganese, and tungsten as one of the main metal components of the first barrier metal film, and (d4) a first copper wiring film formed over the first barrier metal film to embed the first wiring trench and configuring a first wiring together with the first barrier metal film. The second wiring layer includes: (e1) a third interlayer insulating film: (e2) a second wiring trench formed in the third interlayer insulating film, (e3) a second barrier metal film formed over the side surface and the bottom surface of the second wiring trench and containing at least one of tantalum, titanium, ruthenium, manganese, and tungsten as one of the main metal components of the second barrier metal film, (e4) a third barrier metal film formed over the second barrier metal film and containing at least one of cobalt, nickel, and iron as one of the main components of the third barrier metal film, and (e5) a second copper wiring film formed over the third barrier metal film to embed the second wiring trench and configuring a second wiring together with the second and third barrier metal films. The third wiring layer includes: (f1) a magnetic memory element. The first copper wiring film contains an additive impurity and the content thereof is higher than the content of the additive impurity in the second copper wiring film.

29. In the method for manufacturing a semiconductor device as described above in 28, the additive element is at least any one of aluminum, germanium, gallium, manganese, silicon, titanium, and tin.

30. In the method for manufacturing a semiconductor device as described above in 28 or 29, recording of data in the magnetic memory element is effected by passing an electric current through the second wiring.

31. In the method for manufacturing a semiconductor device as described in any one of 28 to 30, the third wiring layer further includes: (f2) a fourth interlayer insulating film having the magnetic memory element provided therein; (f3) a third wiring trench formed in the third interlayer insulating film, located above the magnetic memory element, and extending in a direction perpendicular to the second wiring trench; (f4) a fourth barrier metal film formed over the side surface and the bottom surface of the third wiring trench and containing at least one of tantalum, titanium, ruthenium, manganese, and tungsten as one of the main metal components of the fourth barrier metal film; (f5) a fifth barrier metal film formed over the fourth barrier metal film and containing at least one of cobalt, nickel, and iron as one of the main components of the fifth barrier metal film; and (f6) a third copper wiring film formed over the fifth barrier metal film to embed the third wiring trench, configuring a third wiring together with the fourth and fifth barrier metal films, and comprised of pure copper.

32. In the method for manufacturing a semiconductor device as described above in any one of 28 to 31, the magnetic memory element is a magnetic tunnel junction type magnetic memory element.

33. In the method for manufacturing a semiconductor device as described above in any one of 28 to 32, the first wiring layer and the second wiring layer have, even in a non-memory cell matrix region located outside of the memory cell matrix region in which the magnetic memory elements have been arranged in a matrix form, have substantially similar structures to those in the memory cell matrix region, respectively.

34. In the method for manufacturing a semiconductor device as described above in any one of 28 to 33, the semiconductor device further includes: (g) a fourth wiring layer formed over the third wiring layer and having a substantially similar structure to that of the second wiring layer.

35. In the method for manufacturing a semiconductor device as described above in any one of 28 to 34, the semiconductor device further includes: (h) a fifth wiring layer formed over the third wiring layer and having a substantially similar structure to that of the first wiring layer.

36. In the method for manufacturing a semiconductor device as described above in any one of 28 to 35, the semiconductor device further includes: (i) a copper-penetrating via which penetrates through the semiconductor substrate from the first main surface to the second main surface and is comprised of pure copper.

Explanation of Description Manner, Basic Terms, and Usage in the Invention

In the invention, a description in the embodiments will be made after divided in plural sections if necessary for convenience's sake. These plural sections are not independent each other, but they may each be a part of a single example or one of them may be a partial detail of the other or a modification example of a part or whole of the other one unless otherwise specifically indicated. In principle, description on a portion similar to that described before is not repeated. Moreover, when a reference is made to constituent elements, they are not essential unless otherwise specifically indicated, limited to the number theoretically, or principally apparent from the context that it is not.

Further, in the invention, the term "semiconductor device" or "semiconductor integrated circuit device" means mainly various transistor (active element) units, and devices having, with the transistor units as a main component, resistors, capacitors, and the like integrated on a semiconductor chip or the like (for example, a single crystal silicon substrate). Typical examples of various transistors may include MISFET (metal insulator semiconductor field effect transistor) typified by MOSFET (metal oxide semiconductor field effect transistor). In this case, typical examples of the integrated circuit configuration may include CMIS (complementary metal insulator semiconductor) type integrated circuits typified by CMOS (complementary metal oxide semiconductor) type integrated circuits having an N channel type MISFET and a P channel type MISFET in combination.

In general, the wafer steps of current semiconductor devices, namely, LSI (large scale integration) can be classified roughly into FEOL (front end of line) steps starting from the delivery of silicon wafers as a raw material to a premetal step (including the formation of an interlayer insulating film between the lower end of an M1 wiring layer and a gate electrode structure, formation of a contact hole, formation of a tungsten plug, embedding, and the like) and BEOL steps starting from the formation of the M1 wiring layer to the formation of a pad opening in a final passivation film on the aluminum-based pad electrode (an M7 wiring layer in the below-described embodiment) (which may also include a wafer level package process). The gate electrode patterning step and the contact hole formation step among the FEOL steps are a microfabrication step which requires very fine processing. In the BEOL step, on the other hand, a via and trench formation step, especially, the formation of local wirings at a relatively lower layer (for example, fine embedded wiring layers from M1 to M3 in an embedded wiring structure with six copper layers as in the embodiment of the invention), semi-global wiring (semi-fine embedded wiring layers from M4 to M5), or the like requires microfabrication. Incidentally, the upper-level wirings such as global wiring and pad layer wiring are relatively wide wirings.

2. Similarly, with regard to any material, any composition or the like in the description of the embodiments, the term "X made of A" or the like does not exclude X having, as one of the main configuring components thereof, an element other than A unless otherwise specifically indicated or principally apparent from the context that it is not. For example, the term "X made of A" means that "X has A as a main component thereof". It is needless to say that, for example, the term "silicon member" is not limited to a member made of pure silicon but also means a member made of an SiGe alloy or another multi-element alloy having silicon as a main component or a member containing an additive in addition. Similarly, the term "silicon oxide film", "silicon oxide-based insulating film", or the like is not limited to a relatively pure undoped silicon oxide (undoped silicon dioxide) but needless to say, it embraces FSG (fluorosilicate glass) film, TEOS-based silicone oxide film, SiOC (silicon oxycarbide) film, or carbon-doped silicon oxide film, a thermal oxidation film such as OSG (organosilicate glass) film, PSG (phosphorus silicate glass) film, or BPSG (borophosphosilicate glass) film, a CVD oxide film, silicon oxide films obtained by the method of application such as SOG (spin on glass) and nano-clustering silica (NCC) film, silica-based low-k insulating films (porous insulating films) obtained by introducing pores into members similar to them, and composite films with another silicon-based insulating film which films contain any one of the above-mentioned films as a principal configuring element. In addition, silicon-based insulating films ordinarily used in the semiconductor field like silicon oxide-based insulating films are silicon nitride-based insulating films. Materials which belong to such a group include SiN, SiCN, SiNH, and SiCNH. The term "silicon nitride" herein embraces both SiN and SiNH unless otherwise specified. Similarly, the term "SiCN" herein embraces both SiCN and SiCNH unless otherwise specified.

Incidentally, SiC has properties similar to those of SiN, but SiON should rather often be classified into a silicon oxide-based insulation film.

3. Preferred examples of the shape, position, attribute, and the like will be shown below, however, it is needless to say that the shape, position, attribute, and the like are not strictly limited to these preferred examples unless otherwise specifically indicated or apparent from the context that it is not.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor device (which may be a semiconductor integrated circuit device or an electronic device) is to be formed. It is however needless to say that it embraces a composite wafer of an insulating substrate with a semiconductor layer such as epitaxial wafer, SOI substrate or LCD glass substrate.

6. The MRAM (magnetic random access memory) which is a main target of the invention has MTJ (magnetic tunnel junction) as a memory unit element (magnetic memory element). The mode of the MRAM can be classified roughly into a field write mode and an STT (spin-torque-transfer) mode. Further, the field-write mode writing method which will be described mainly in the invention can be classified into an astroid mode and a toggle mode. In the below-described embodiments, a specific description will be made mainly on the asteroid mode. It is however needless to say that the invention can be applied to the toggle mode (for the reinforcement of a write magnetic field and blocking) or an STT mode (auxiliary reinforcement of a magnetic field for writing and blocking).

The configuration of the magnetic memory element (MTJ element) which will be described below is only an example and various modification examples can be used. As the planar shape of the MTJ element, an elliptical shape (including a circular shape) providing uniform antimagnetism, more precisely, an elliptical thin plate (circular thin plate) will be described, but it is needless to say that an asymmetrical shape can also be employed. In the below-described embodiments, the MTJ element using, as a free layer, a single ferromagnetic layer is shown but it is needless to say that element may use an SAF (synthetic antiferromagnetic) layer or may have another multilayer structure.

Further, MRAM is, for example, a general-purpose memory (or memory for exclusive use) comprised of a memory cell matrix region which occupies most of a chip area and a memory peripheral circuit which is located at the periphery of the memory cell matrix region; and an embedded memory mounted on one chip together with a microprocessor or another logic circuit. A specific description will next be made with the embedded memory as a main example, but it is needless to say that the invention can be applied also to a general-purpose memory (or memory for exclusive use). In the invention, therefore, the term "non-memory cell matrix region" embraces a microprocessor portion, another logic circuit portion, an MRAM peripheral circuit, a memory cell matrix region other than MRAM, a peripheral circuit thereof, and an I/O circuit portion.

7. In the invention, the term "clad wiring" means a wiring having a ferromagnetic thin film (ferromagnetic barrier metal film) covering a portion or almost whole portion of the periphery of a copper wiring or the like. The term "non-clad wiring" means, on the other hand, a wiring without such a ferromagnetic barrier metal film.

In the invention, the term "magnetic metal" or "magnetic alloy" usually means a metal or the like having a transfer temperature (Curie temperature, and Neel temperature in the case of antiferromagnetic), at which spontaneous magnetism appears, sufficiently higher than normal temperature and exhibits ferromagnetism at normal temperature. It also embraces a metal or the like exhibiting ferrimagnetism or antiferromagnetism at normal temperature unless otherwise specifically indicated or principally apparent that it is not.

Details of Embodiment

Embodiments will next be described more specifically. In each of the drawings, the same or similar members will be identified by the same or like numbers or reference numbers and overlapping descriptions will be omitted in principle.

Moreover, when in the accompanying drawings, hatching or the like complicates the drawing or a difference from a space portion is clear, hatching is sometimes omitted even from a cross-sectional view. In this connection, when it is apparent from the description or the like that a hole is clearly closed in a planar view, a contour of the background is sometimes omitted. Further, hatching may be applied even when it is not a cross-sectional view in order to clearly show that it is not a space portion.

1. Description on a main structure or the like of a semiconductor device according to a first embodiment of the invention (mainly from FIG. 1 to FIG. 8)

An example described in this section is MRAM mounted in a microcomputer chip, logic chip, or another signal processing chip (MRAM embedded logic chip), but it is needless to say that MRAM may be mounted in a chip exclusively used for memory.

In the invention, a specific description will be made on a product in 130-nm technology node as an example, but it is needless to say that the invention can be applied to a product in another technology node.

Figure 2:
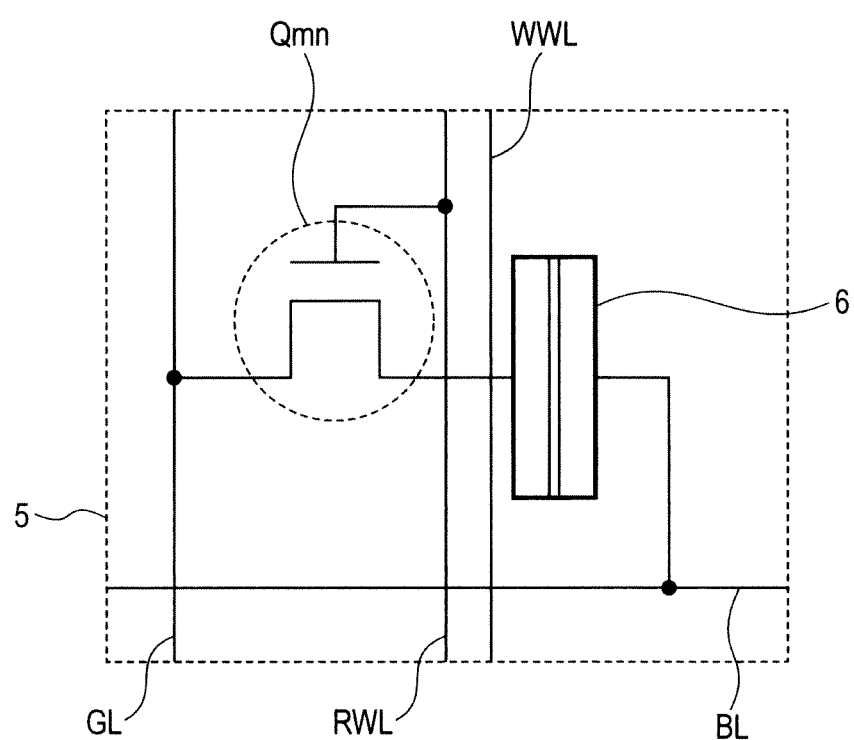
FIG. 2 is an equivalent circuit diagram of a unit cell 5 configuring a memory cell matrix region 3 of FIG. 1.
Figure 3:
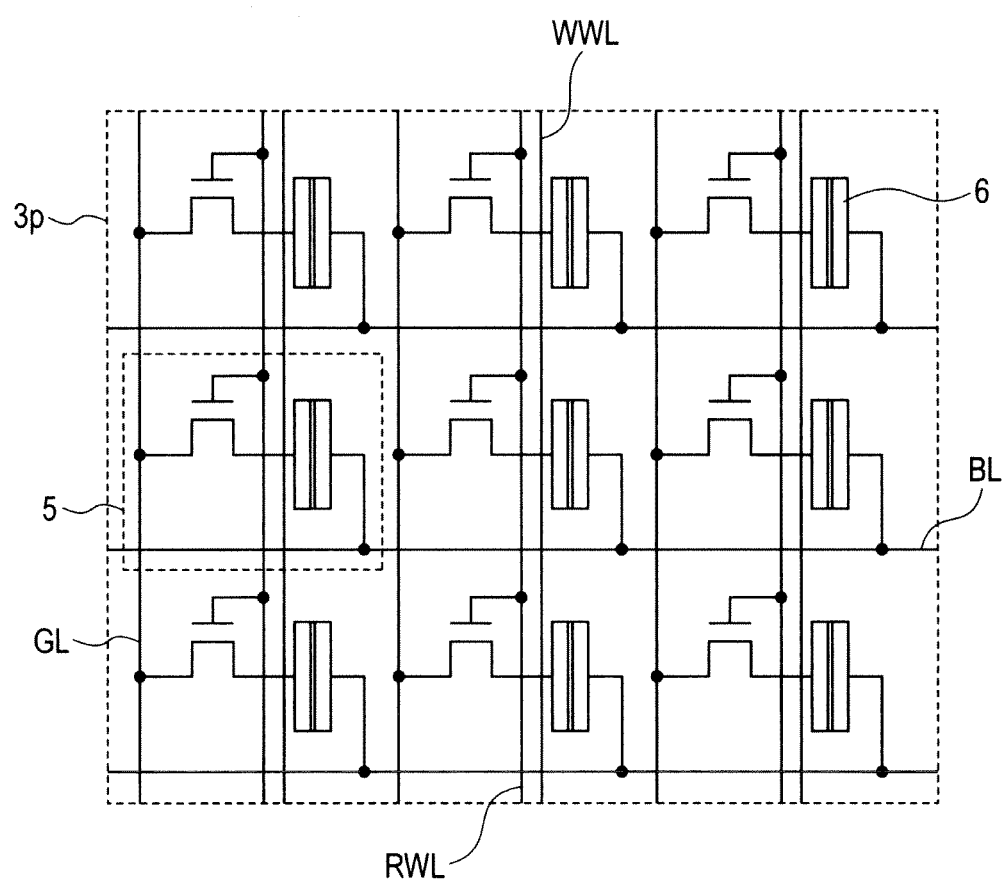
FIG. 3 is a layout of an equivalent circuit of a portion 3P cut out from the memory cell matrix region of FIG. 1.
Figure 4:
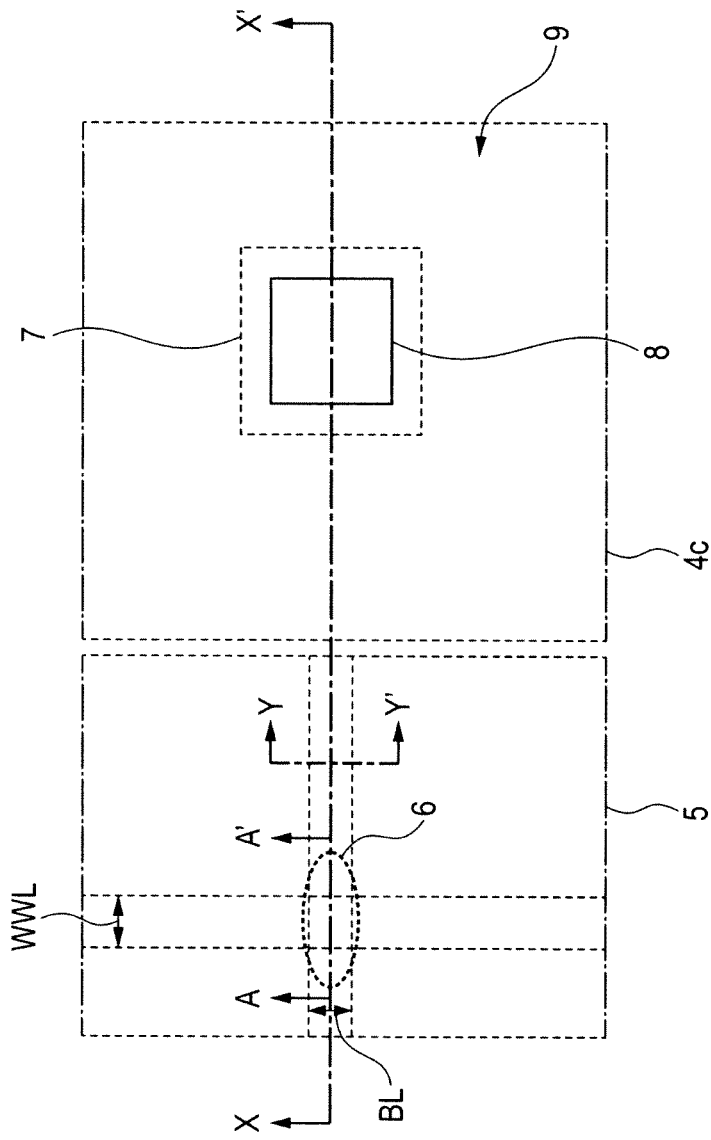
FIG. 4 is an enlarged top view of a chip showing the unit memory cell portion 5 and the cutout portion 4c of a non-memory cell matrix region in FIG. 1.
Figure 5:
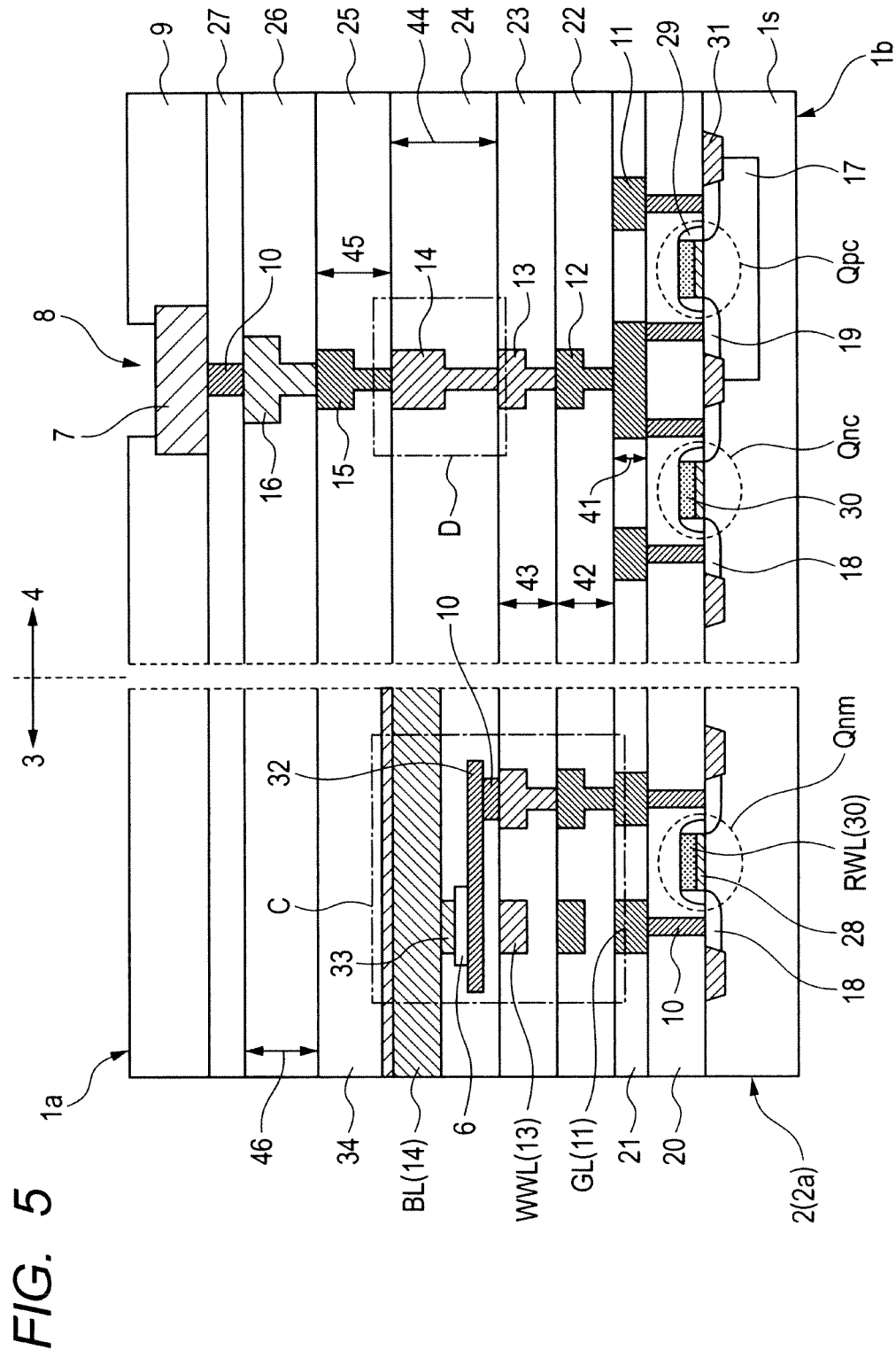
FIG. 5 is a schematic cross-sectional view of a device corresponding to the X-X' cross-section of FIG. 4.
Figure 6:
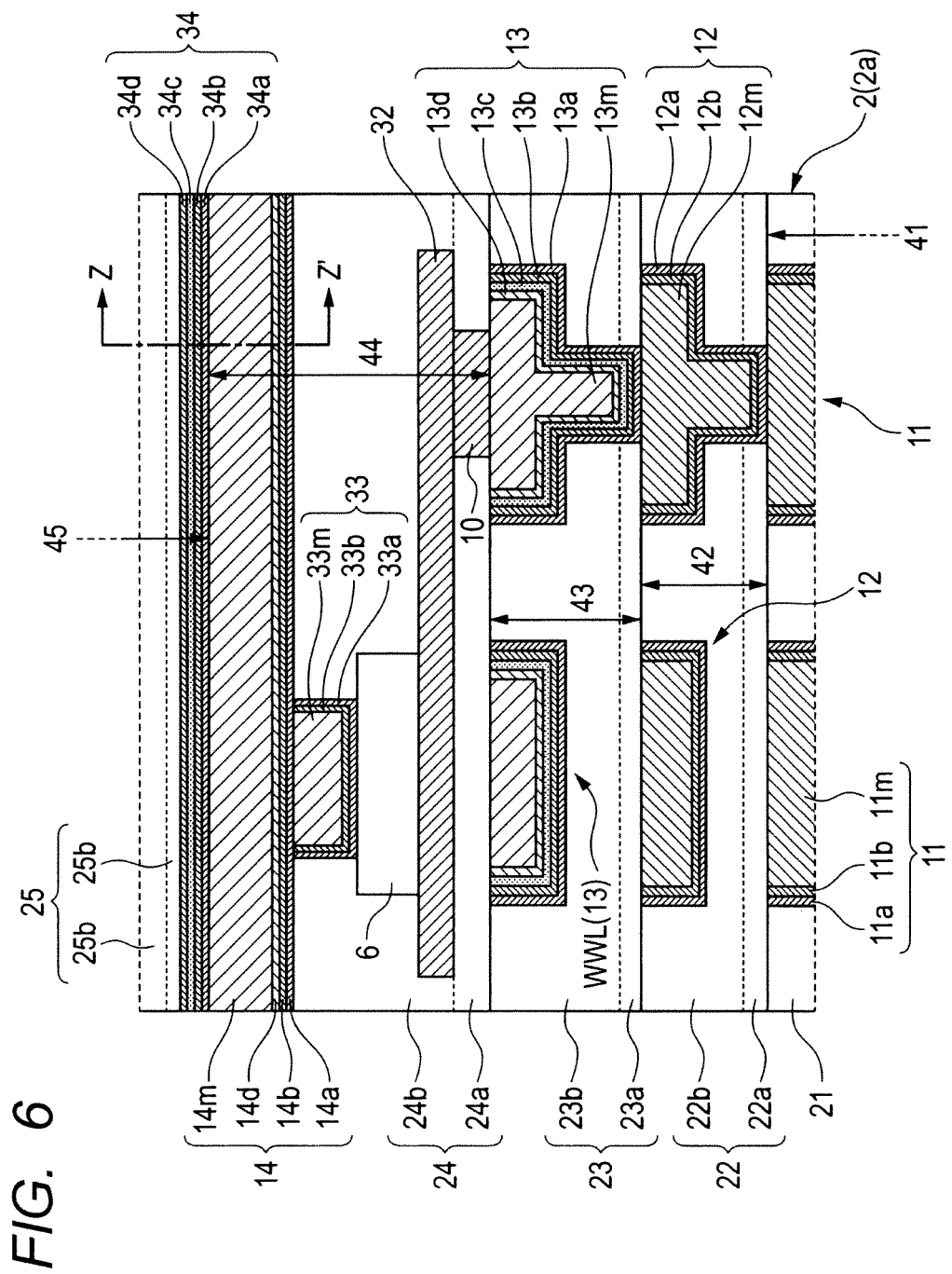
FIG. 6 is an enlarged detailed cross-sectional view of the cutout portion C of the cross-section around the magnetic memory element shown in FIG. 5.
Figure 7:
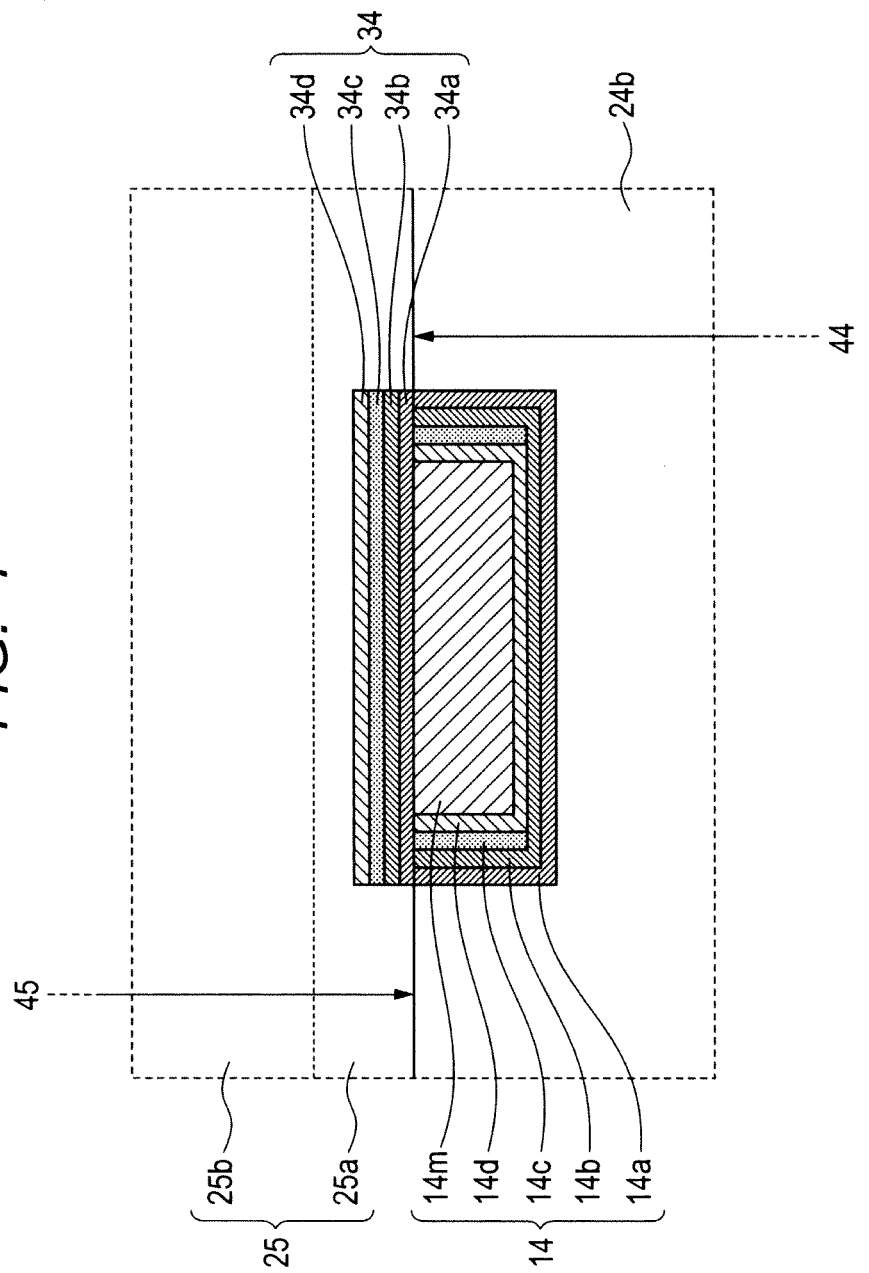
FIG. 7 is a regionally enlarged view of the device cross-section corresponding to the Y-Y' cross-section of FIG. 4 or the Z-Z' cross-section of FIG. 6.
Figure 8:
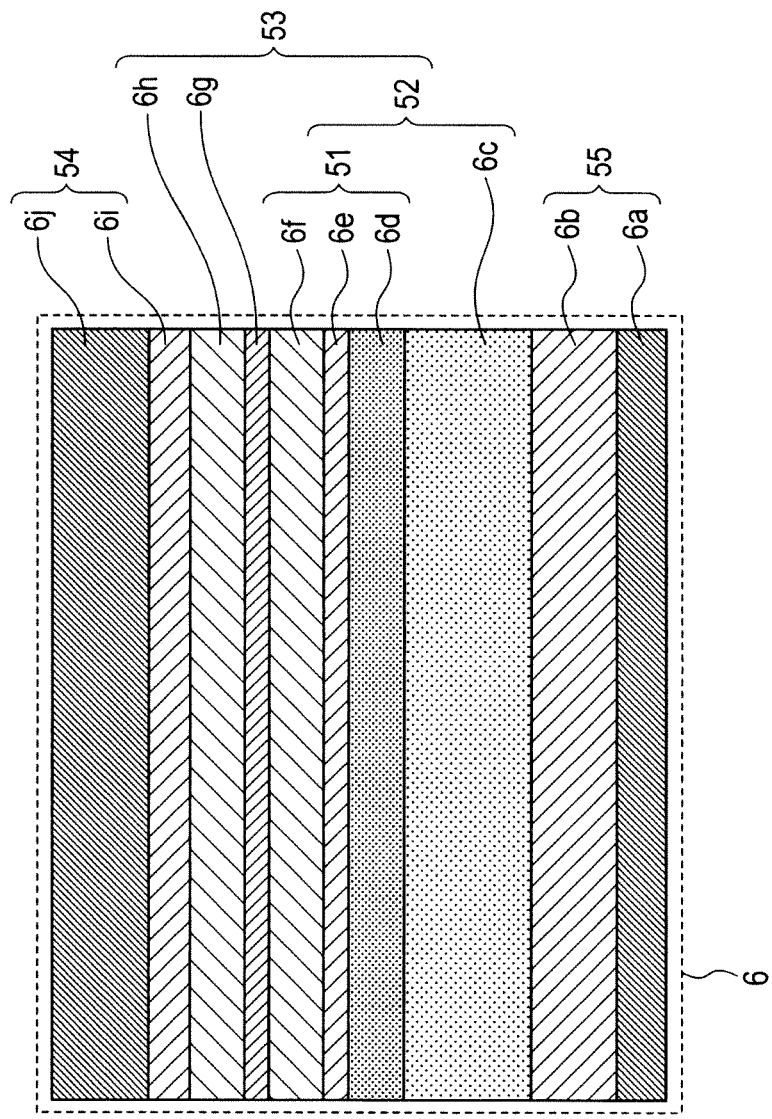
FIG. 8 is an enlarged cross-sectional view of a magnetic memory element 6 (MTJ) of FIG. 5 or FIG. 6.
Figure 23:
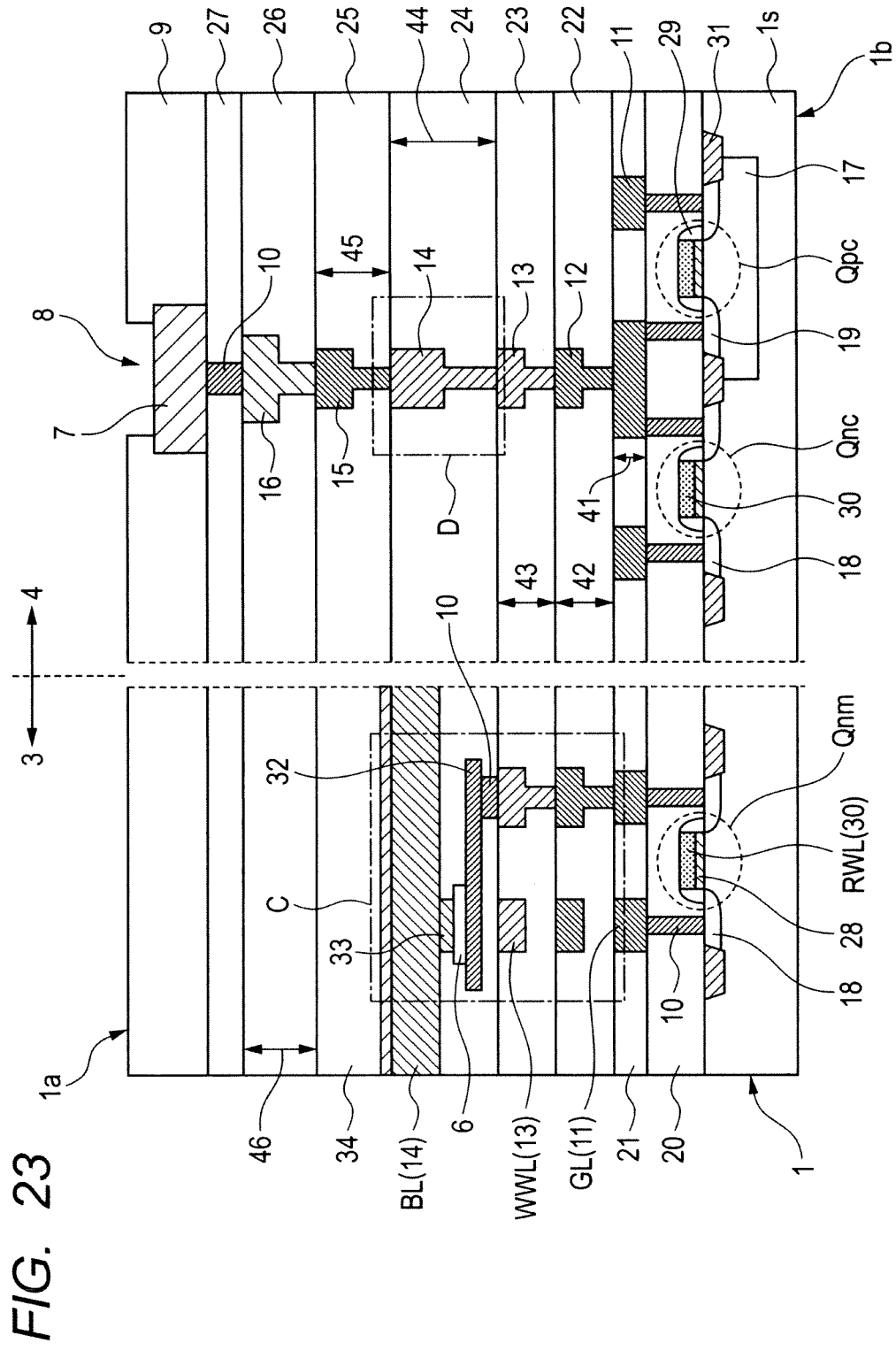
FIG. 23 is a device cross-sectional view during manufacturing steps (steps subsequent to the step of FIG. 22) corresponding to FIG. 5 for describing the outline of the main process in the manufacturing method of a semiconductor device according to the first embodiment of the invention.

FIG. 1 is a top surface layout of a semiconductor chip corresponding to a semiconductor device according to a first embodiment of the invention. FIG. 2 is an equivalent circuit diagram of a unit cell 5 configuring a memory cell matrix region 3 of FIG. 1. FIG. 3 is an equivalent circuit layout of a portion 3P cut out from the memory cell matrix region of FIG. 1. FIG. 4 is an enlarged top view of a chip showing the unit memory cell portion 5 and the cutout portion 4c of a non-memory cell matrix region in FIG. 1. FIG. 5 is a schematic cross-sectional view of a device corresponding to the X-X' cross-section of FIG. 4. FIG. 6 is an enlarged detailed cross-sectional view of the cutout portion C of the cross-section around the magnetic memory element shown in FIG. 5. FIG. 7 is a regionally enlarged view of the device cross-section corresponding to the Y-Y' cross-section of FIG. 4 or the Z-Z' cross-section of FIG. 6. FIG. 8 is an enlarged cross-sectional view of a magnetic memory element 6 (MTJ) of FIG. 5 or FIG. 6. FIG. 32 is an enlarged cross-sectional view around the M4 wiring (third wiring) 14 corresponding to the cross-sectional enlarged view D around the wiring of a non-memory cell matrix region formed in the same layer as the bit line of FIG. 5 (FIG. 23). Referring to these drawings, the main structure and the like of the semiconductor device according to the first embodiment of the invention will be described.

First, the top surface layout of a chip will be described referring to FIG. 1. As illustrated in FIG. 1, a semiconductor chip 2 (2a) has, on the top surface 1a thereof (the first main surface, that a surface opposite to the back surface 1b), a memory cell matrix region 3 of an MRAM. It has, on the other region, that is, a non-memory cell matrix region 4, a microprocessor portion, another logic circuit portion, an MRAM peripheral circuit, a memory cell matrix region other than the MRAM, a peripheral circuit thereof, an I/O circuit portion, and the like.

Next, an enlarged circuit diagram of a portion of a unit memory cell 5 of the MRAM illustrated in FIG. 1 is shown in FIG. 2. A portion 3p of the memory cell matrix region of the MRAM illustrated in FIG. 1 is shown in FIG. 3. As shown in FIGS. 2 and 3, the memory cell 5 has, in the vicinity of the center thereof, usually a magnetic memory element, that is, a magnetic tunnel junction (MTJ) type memory element 6 per cell. A read selection MISFET (Qnm) is electrically coupled between one of the terminals of the magnetic memory element and a ground line GL. The other terminal of the magnetic tunnel junction type memory element 6 is electrically coupled to a bit line BL. The gate electrode of the read selection MISFET (Qnm) is electrically coupled to a read word line RWL which intersects at right angles with the bit line BL and extends parallel to the ground line GL. In the vicinity of the magnetic tunnel junction type memory element 6, a write word line which intersects at right angles with the bit line BL and extends parallel to the ground line GL and the read word line RWL extends. Writing of data in the magnetic memory element 6 is performed by passing an electric current through the write word line WWL, that is, an M3 wiring 13 (second wiring) and the bit line BL, that is, an M4 wiring 14 (third wiring) illustrated in FIGS. 2 and 6.

Next, an enlarged top view of the memory cell 5 and a cutout portion 4c of the non-memory cell matrix region is shown in FIG. 4 (this plan view illustrates only typical members in order to ensure simplicity). As illustrated in FIG. 4, the non-memory cell matrix region 4 (4c) has, in a portion of the surface region thereof, an aluminum bonding pad 7 and a final passivation film 9 covering therewith the pad has a pad opening 8 at a position corresponding to the aluminum bonding pad 7. On the other hand, in the memory cell 5, the bit line BL and the write word line WWL extend so that they orthogonally cross each other at the magnetic tunnel junction type memory element 6 having, for example, an elliptical shape.

Next, the X-X' cross-section of FIG. 4 (also corresponding roughly to the X-X' cross-section of FIG. 1) is shown in FIG. 5. As shown in FIG. 5, the semiconductor chip 2 (2a) has, in the non-memory cell matrix region 4 in the upper-surface-side surface region of the semiconductor substrate portion is (for example, p-type silicon single crystal substrate portion) thereof, for example, an N well region 17 and the N well region 17 has, in the surface region thereof, P type source drain regions 19 configuring a p channel type MISFET (Qpc) for general logic circuit and an STI (shallow trench isolation) insulating film 31 for isolating it from another element. In the non-memory cell matrix region 4 in the upper-surface-side surface region of the P type silicon single crystal substrate portion is in which the N well region 17 has not been provided, N type source drain regions 18 of an N channel type MISFET (Qnc) for general logic circuit and an STI insulating film 31 for isolating it from another element are provided. In the memory cell matrix region 3 in the upper-surface-side surface region of the P type silicon single crystal substrate portion is in which the N well region 17 has not been provided, N type source drain regions 18 of the read selection MISFET (Qnm) and an STI insulating film 31 for isolating it from another element are provided. Over the upper-surface-side surface of the P type silicon single crystal substrate portion is between the N type source drain regions 18 of each of the read selection MISFET (Qnm) and the N channel type MISFET (Qnc) for general logic circuit, a gate insulating film 28, a polysilicon gate electrode 30, and a sidewall insulating film 29 are provided. Similarly, a gate insulating film 28, a polysilicon gate electrode 30, and a sidewall insulating film 29 are provided over the surface of the N well region 17 between the P type source drain regions 19 of the P channel type MISFET (Qpc) for general logic circuit. In this structure, the polysilicon gate electrode 30 of the read selection MISFET (Qnm) is, for example, a read word line RWL. Incidentally, the P channel MISFET (Qpc) for general logic circuit and the N channel MISFET (Qnc) for general logic circuit configure a CMOS or CMIS unit circuit (inverter, NOR, NAND, or the like).

The P type silicon single crystal substrate portion is has, on the upper surface thereof, a premetal interlayer insulating film 20 (first interlayer insulating film) having, for example, a silicon oxide-based insulating film as a main constituent so as to cover the gate electrode structure (the gate insulating film 28, the polysilicon gate electrode 30, and the sidewall insulating film 29) of the MISFETs (Qnm, Qnc, Qpc) and a plurality of tungsten plugs 10 penetrate through this interlayer insulating film.

This premetal interlayer insulating film 20 (first interlayer insulating film) has thereover an M1 wiring layer 41. This M1 wiring layer 41 is comprised of, for example, an interlayer insulating film 21 (second interlayer insulating film) having a silicon oxide-based insulating film as a main constituent, an M1 wiring 11 (Al-added no-clad wiring) embedded therein, and the like. A portion of this M1 wiring 11 is, for example, a ground line GL in the memory cell matrix region 3.

This M1 wiring layer 41 has thereon an M2 wiring layer 42 (first wiring layer) and this M2 wiring layer 42 is comprised of an interlayer insulating film 22 (third interlayer insulating film) having, for example, a silicon oxide-based insulating film as a main constituent, an M2 wiring 12 (Al-added non-clad wiring) embedded therein, and the like. As materials to be used for the silicon oxide-based interlayer insulating film in the present embodiment, Low-k insulating films such as SiOC are preferred as the interlayer insulating film 21 (second interlayer insulating film), an upper silicon oxide-based insulating film 22$b$, and an upper silicon oxide-based insulating film 23$b$, and an upper silicon-based oxide insulating film 24$b$, while ordinary silicon oxide films such as plasma TEOS silicon oxide film are preferred as the other films such as the premetal interlayer insulating film 20 (first interlayer insulating film), an upper silicon oxide-based insulating film 25$b$, and other upper interlayer insulating films.

This M2 wiring layer 42 has thereon an M3 wiring layer 43 (second wiring layer) and this M3 wiring layer 43 is comprised of, for example, an interlayer insulating film 23 (fourth interlayer insulating film) having a silicon oxide-based insulating film as a main constituent, an M3 wiring 13 (Al-free clad wiring) embedded therein, and the like. A portion of this M3 wiring 13 serves, for example, as a write word line WWL in the memory cell matrix region 3.

This M3 wiring layer 43 has thereon an M4 wiring layer 44 (third wiring layer) and this M4 wiring layer 44 is comprised of, for example, an interlayer insulating film 24 (fifth interlayer insulating film) having a silicon oxide-based insulating film as a main constituent, an M4 wiring 14 (Al-free clad wiring) embedded therein, and the like. A portion of this M4 wiring 14 serves, for example, as a bit line BL in the memory cell matrix region 3. Further, in the memory cell matrix region 3 of the M4 wiring layer 44, a memory element structure is inserted below the M4 wiring 14 (bit line). The memory element structure is comprised of a tungsten plug 10 for electrically coupling to the M3 wiring 13, a metal strap 21 (for example, a TaN extraction line) for electrically coupling the tungsten plug to the magnetic memory element 6, an upper contact electrode 33 for electrically coupling the magnetic memory element 6 to the bit line BL, and the like. The M4 wiring 14 (bit line BL) has thereon a cap barrier metal film 34 (this metal film itself belongs, as a geometric layer, to an M5 wiring layer 45 which will be described next).

This M4 wiring layer 44 has thereon an M5 wiring layer 45 (fourth wiring layer) and this M5 wiring layer 45 is comprised of, for example, an interlayer insulating film 25 having a silicon oxide-based insulating film as a main constituent, an M5 wiring 15 (Al-added non-clad wiring) embedded therein, and the like.

This M5 wiring layer 45 has thereon an M6 wiring layer 46 (fifth wiring layer) and this M6 wiring layer 46 is comprised of, for example, an interlayer insulating film 26 having a silicon oxide insulating film as a main constituent, an M6 wiring 16 (Al-free non-clad wiring) embedded therein, and the like. Incidentally, it is preferred that wirings such as the M6 wiring 16 are formed in this M6 wiring layer 46 with the minimum pitch greater than that of the wirings in the wiring layers below the M6 wiring layer 46 (the term "minimum pitch" as used herein means a sum of the minimum width of interlayer film between the wirings and the minimum width of the wiring) and the thickness of the interlayer insulating film 26 formed in this M6 wiring layer 46 is greater than the thickness of the interlayer insulating film formed in the wiring layers below this M6 wiring layer 46.

This M6 wiring layer 46 has thereon an interlayer insulating film 27, which lies below a pad layer, having, for example, a silicon oxide-based insulating film as a main constituent and a tungsten plug 10 penetrates through this insulating film.

Further, this interlayer insulating film 27, which lies below a pad layer, has thereon an aluminum-based bonding pad 7 (it may be a pad layer wiring as a wiring) and a final passivation film 9 covering the bonding pad. This final passivation film 9 has therein a pad opening 8 corresponding to the aluminum bonding pad 7. The final passivation film 9 is usually an insulating film having a silicon oxide-based insulating film as a main constituent but it may be a film stack with a silicon nitride film or the like. Alternatively, for example, an organic final passivation film comprised of a polyimide film or the like may be stacked over such an inorganic final passivation film 9.

Next, an enlarged cross-sectional view of the cutout portion C of the cross-section around the magnetic memory element illustrated in FIG. 5 is shown in FIG. 6. A detailed structure of the wiring of each wiring layer in the memory cell matrix region 3 and that in the non-memory cell matrix region 4 are the same so that a description will be made with the memory cell matrix region 3 as an example. Incidentally, as illustrated in FIG. 7, the M4 wiring (third wiring) 14 corresponding to the bit line BL has a structure a little different from that of the wiring in another layer from the standpoint of enclosing a write magnetic field of the like. The M4 wiring (third wiring) 14 in the non-memory cell matrix region 4 which is manufactured simultaneously with it has therefore a structure corresponding to it. Described specifically, as illustrated in FIG. 32, when a ferromagnetic barrier metal film (fifth barrier metal film) 14$c$ is removed by argon sputter etching or the like from the bottom surface of the M4 wiring trench of the bit line BL, the ferromagnetic barrier metal film 14$c$ is removed from the bottom surface of the wiring trench and via so that the ferromagnetic barrier metal film 14$c$ remains only on the side surface of the wiring trench and via.

As illustrated in FIG. 6 (with regards to the details of the M4 wiring 14 and the cap barrier film 34 thereof, refer to FIG. 7 which is a Z-Z' cross-section of FIG. 6), the M1 wiring (Al-added non-clad wiring) of the M1 wiring layer 41 is a copper-based embedded wiring and is comprised of, for example, a non-ferromagnetic metal nitride barrier film 11$a$ (for example, a tantalum nitride thin-film), a non-ferromagnetic barrier metal film 11$b$ (for example, a tantalum thin-film) thereon, a relatively thick aluminum-added copper wiring film 11$m$, and the like.

The interlayer insulating film 33 (third interlayer insulating film) of the M2 wiring layer 42 (first wiring layer) is comprised of a lower copper-diffusion barrier insulating film 22$a$ (for example, a silicon carbide-based insulative copper-diffusion barrier film such as SiCN film), an upper silicon oxide-based insulating film 22$b$, and the like. On the other hand, the M2 wiring 12 (Al-added non-clad wiring) is a copper-based embedded wiring and it is comprised of, for example, a non-ferromagnetic metal nitride barrier film 12a (for example, a tantalum nitride thin-film), a non-ferromagnetic barrier metal film 12b (for example, a tantalum thin-film) thereon, that is, a first barrier metal film, and an aluminum-added relatively thick copper wiring film 12m.

The interlayer insulating film 23 (fourth interlayer insulating film) of the M3 wiring layer 43 (second wiring layer) is comprised of a lower copper-diffusion barrier insulating film 23a (for example, a silicon carbide-based insulative copper-diffusion barrier film such as SiCN film), an upper silicon oxide-based insulating film 23b, and the like. On the other hand, the M3 wiring 13 (Al-free clad wiring) is a copper-based embedded wiring and is comprised of, for example, a non-ferromagnetic metal nitride barrier film 13a (for example, a tantalum nitride thin-film), a lower non-ferromagnetic barrier metal film 13b thereon (for example, a tantalum thin-film), that is, a second barrier metal film, a ferromagnetic barrier metal film (third barrier metal film) 13c (for example, an NiFe film), an upper non-ferromagnetic barrier metal film 13d (for example, a tantalum thin-film), and an aluminum-free relatively thick copper wiring film 13m (comprised of relatively pure copper).

The interlayer insulating film 24 of the M4 wiring layer 44 (third wiring layer) is comprised of a lower copper-diffusion barrier insulating film 24a (for example, a silicon carbide-based insulative copper-diffusion barrier film such as SiCN film), an upper silicon oxide-based insulating film 24b, and the like. On the other hand, the M4 wiring 14 (Al-free clad wiring) is a copper-based embedded wiring and is comprised of, for example, a non-ferromagnetic metal nitride barrier film 14a (for example, a tantalum nitride thin-film), a lower non-ferromagnetic barrier metal film 14b thereon (for example, a tantalum thin-film), that is, a fourth barrier metal film, a ferromagnetic barrier metal film (fifth barrier metal film) 14c (for example, an NiFe film), an upper non-ferromagnetic barrier metal film 14d (for example, a tantalum thin-film), and a relatively thick aluminum-free copper wiring film 14m (comprised of relatively pure copper). Between the M4 wiring 14 (third wiring) and the M3 wiring 13 (second wiring), inserted is a memory element structure comprised of a tungsten plug 10 for electrically coupling with the M3 wiring 13, a metal strap 32 (for example, a TaN extraction line) for electrically coupling the tungsten plug to the magnetic memory element 6, an upper contact electrode 33 for electrically coupling the magnetic memory element 6 to the bit line BL, and the like. The upper contact electrode 33 is, for example, in a pad form in a planar view and is comprised of a non-ferromagnetic metal nitride barrier film 33a (for example, tantalum nitride thin-film), a non-ferromagnetic barrier metal film 33b thereon (for example, a tantalum thin-film), a relatively thick aluminum-free copper wiring film 33m (comprised of relatively pure copper), and the like. The magnetic memory element 6 is, for example, in an elliptical form in a planar view. The metal strap 32 lying therebelow is in an elongate lead form and is electrically coupled to the M3 wiring 13 (second wiring) below the strap via the tungsten plug 10 in a pad form.

The cap barrier metal film 34 is comprised of, for example, a non-ferromagnetic metal nitride barrier film 34a (for example, a tantalum nitride thin-film), a lower non-ferromagnetic barrier metal film 34b (for example, a tantalum thin-film), a ferromagnetic barrier metal film 34c (for example, an NiFe film), and an upper non-ferromagnetic barrier metal film (for example, a tantalum thin-film).

The interlayer insulating film 25 of the M5 wiring layer 45 (fourth wiring layer) is comprised of a lower copper-diffusion barrier insulating film 25a (for example, a silicon carbide-based insulative copper-diffusion barrier film such as SiCN film), an upper silicon oxide-based insulating film 25b, and the like.

The detailed film stack structure of an example of the magnetic memory element 6 (MTJ) will next be described referring to FIG. 8. As illustrated in FIG. 8, the magnetic memory element has, as the bottom layer, a lower barrier layer 55 (lower electrode) comprised of a lower tantalum film 6a, an upper ruthenium film 6b, and the like and an MTJ portion 53 on the lower barrier layer. The MTJ portion has thereon an upper barrier layer 54 (upper electrode) comprised of a lower ruthenium film 6i, an upper tantalum film 6j, and the like. The upper barrier layer 54 has a thickness of preferably from about 40 to 70 nm. Preferred examples of the material of the upper barrier layer 54 (preferably a non-magnetic metal) include, in addition to a film stack of tantalum and ruthenium, a single layer of tantalum, tantalum nitride, and ruthenium, and a multilayer film obtained using them in combination. Preferred examples of the lower barrier layer 55 (preferably a non-magnetic metal) include, in addition to a film stack of tantalum and ruthenium, a single layer film of tantalum, tantalum nitride, ruthenium, titanium, titanium nitride, (nonmagnetic metal) NiFeCr alloy, and a multilayer film obtained using them in combination. The lower barrier layer 55 has a thickness of preferably from about 25 to 45 nm.

The MTJ portion 53 between the upper electrode 54 and the lower electrode 55 is comprised of a tunnel insulating film 6g, a free-layer ferromagnetic film 6h, and the like stacked in order of mention on a fixed layer 52. The tunnel insulating film 6g has a thickness of preferably from about 0.6 to 1.5 nm. Preferred examples of the material of the tunnel insulating film 6g include single layer films made of an oxide of aluminum, magnesium, hafnium, or the like and multilayer films obtained using them in combination. The free-layer ferromagnetic film 6h has a thickness of preferably from about 3 to 9 nm. The material of the free layer ferromagnetic film 6h is a ferromagnetic metal belonging to soft magnetic materials or an alloy thereof. Preferred examples include single layers of a ferromagnetic metal such as nickel, cobalt, or iron, single layers of an alloy thereof (such as permalloy, specifically, NiFe or NiFeCo), single layers of an alloy between a ferromagnetic metal and a non-ferromagnetic metal such as boron or ruthenium (for example, CoFeB or NiFeCoB), and composite films thereof (including multi-layer films including a non-ferromagnetic metal film, specifically, for example, CoFe/NiFe and CoFeB/Ru/CoFeB).

The fixed layer 52 is comprised of an SAF (synthetic anti-ferromagnetic) portion 51, a fixed-layer trinsinc anti-ferromagnetic film 6c (for example, PtMn), and the like. The fixed-layer intrinsic anti-ferromagnetic film 6c has a thickness of preferably from about 12 to 25 nm. Preferred examples of the material of the fixed-layer intrinsic anti-ferromagnetic film 6c include, in addition to PtMn, IrMn.

The SAF portion 51 (which may be comprised of a single-layer ferromagnetic material similar to that of the free layer, that is, a soft magnetic material) is obtained by successively stacking a lower ferromagnetic film 6d (for example, CoFe), an intermediate non-magnetic metal film 6e (for example, a nonmagnetic metal such as Ru having a thickness of, for example, from about 0.6 to 0.9 nm), and an upper ferromagnetic film 6f (for example, CoFeB) one after another. Incidentally, it is desired to adjust the thickness of the lower ferromagnetic film 6d and the upper ferromagnetic film 6f so that the magnetization of the entire SAF portion 52 becomes zero. The lower ferromagnetic film 6d has a thickness of preferably from about 1.5 to 2.5 nm. Preferred examples of the material of the lower ferromagnetic film 6d include, in addition to CoFe, single layers of an alloy of Co, Fe, B, or the like (for example, CoFe or CoFeB) showing ferromagnetism and film stacks thereof (for example, CoFe/CoFeB).

The upper ferromagnetic film 6f has a thickness of preferably, for example, from about 1.5 to 2.5 nm. Preferred examples of the upper ferromagnetic film 6f include single layers of a simple substance or alloy of Ni, Co, Fe, or B showing ferromagnetism (for example, Fe, NiFe, NiFeCo, CoFeB, and NiFeCoB) and film stacks thereof (for example, CoFe/CoFeB).

2. Description on the outline of the main process in a manufacturing method of a semiconductor device according to the first embodiment of the invention (mainly, from FIG. 9 to FIG. 23).

In this section, the outline of the main process after formation of the M2 wiring layer 42 will be described. In the invention, the term "wiring trench" means not only a trench for embedding a wiring therein but also a via hole and the like unless otherwise indicated or apparent from the context.

Figure 9:
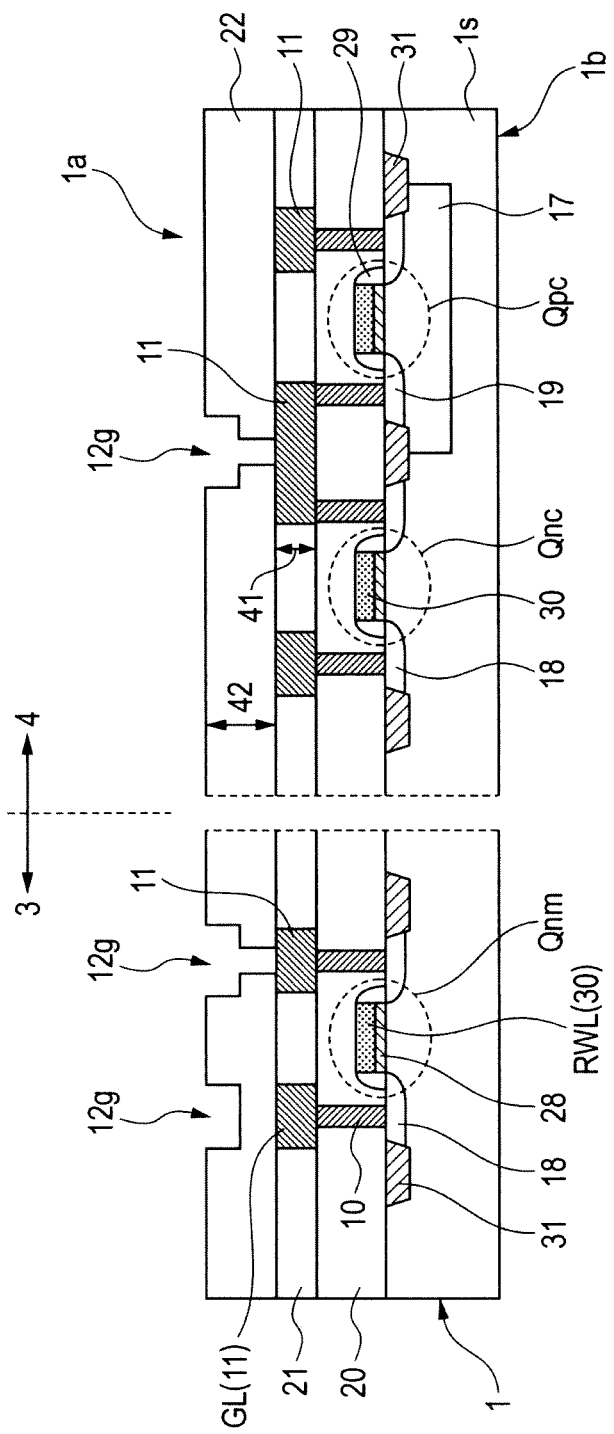
FIG. 9 is a device cross-sectional view during a manufacturing step (step of forming a wiring trench and a via for embedding an M2 wiring therein) corresponding to FIG. 5 for describing the outline of the main process in the manufacturing method of a semiconductor device according to the first embodiment of the invention.
Figure 10:
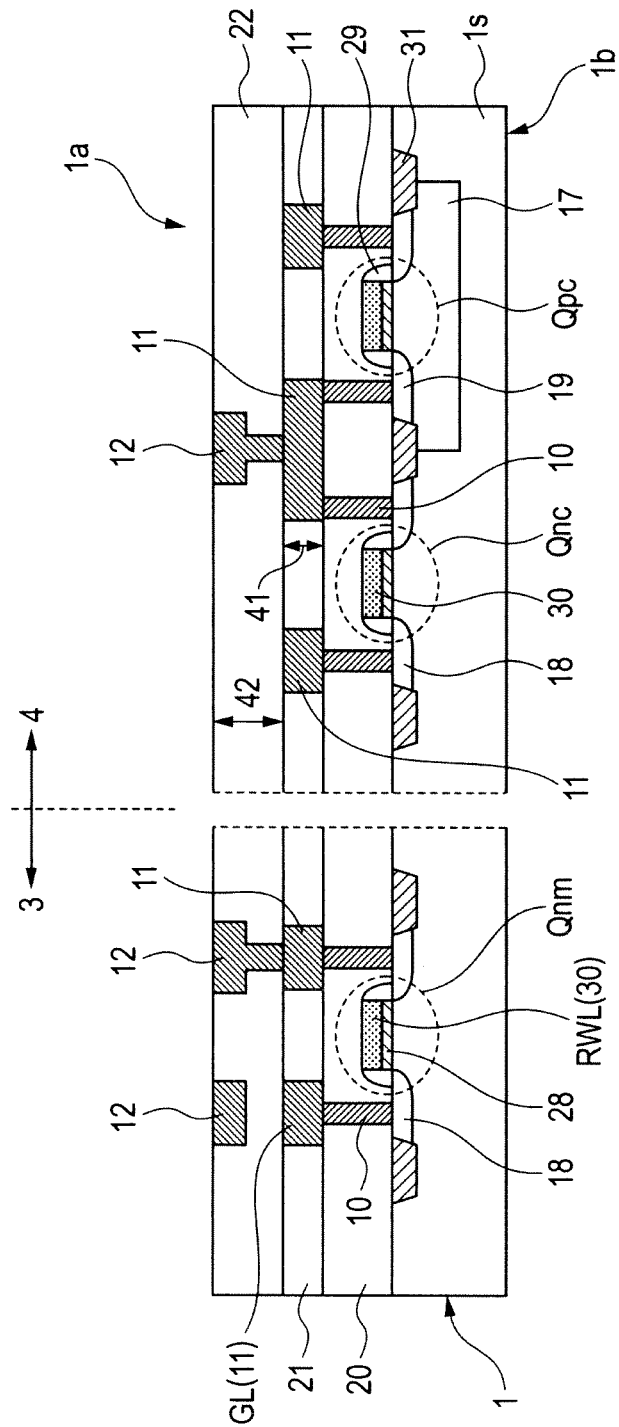
FIG. 10 is a device cross-sectional view during a manufacturing step (step of embedding the M2 wiring) corresponding to FIG. 5 for describing the outline of the main process in the manufacturing method of a semiconductor device according to the first embodiment of the invention.
Figure 11:
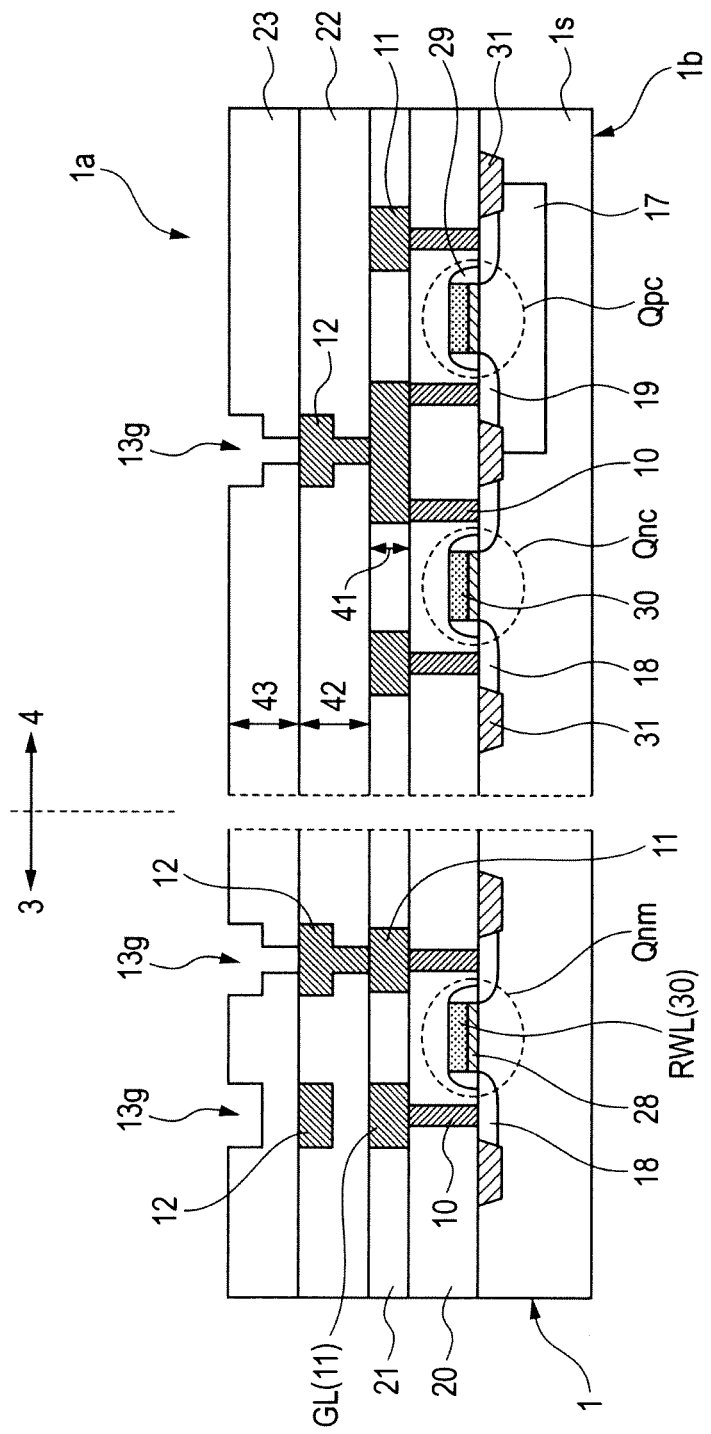
FIG. 11 is a device cross-sectional view during a manufacturing step (step of forming a wiring trench and a via for embedding an M3 wiring layer therein) corresponding to FIG. 5 for describing the outline of the main process in the manufacturing method of a semiconductor device according to the first embodiment of the invention.
Figure 12:
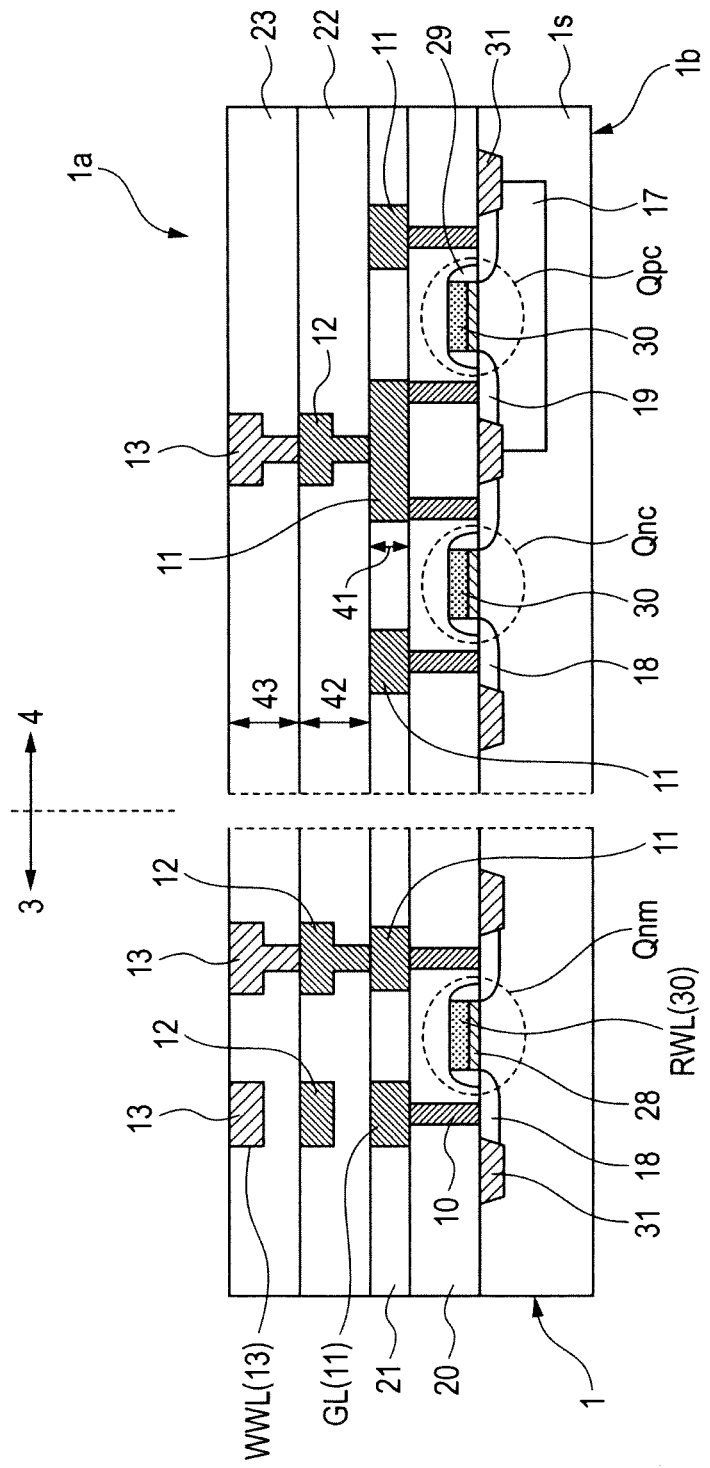
FIG. 12 is a device cross-sectional view during a manufacturing step (step of embedding the M3 wiring) corresponding to FIG. 5 for describing the outline of the main process in the manufacturing method of a semiconductor device according to the first embodiment of the invention.
Figure 13:
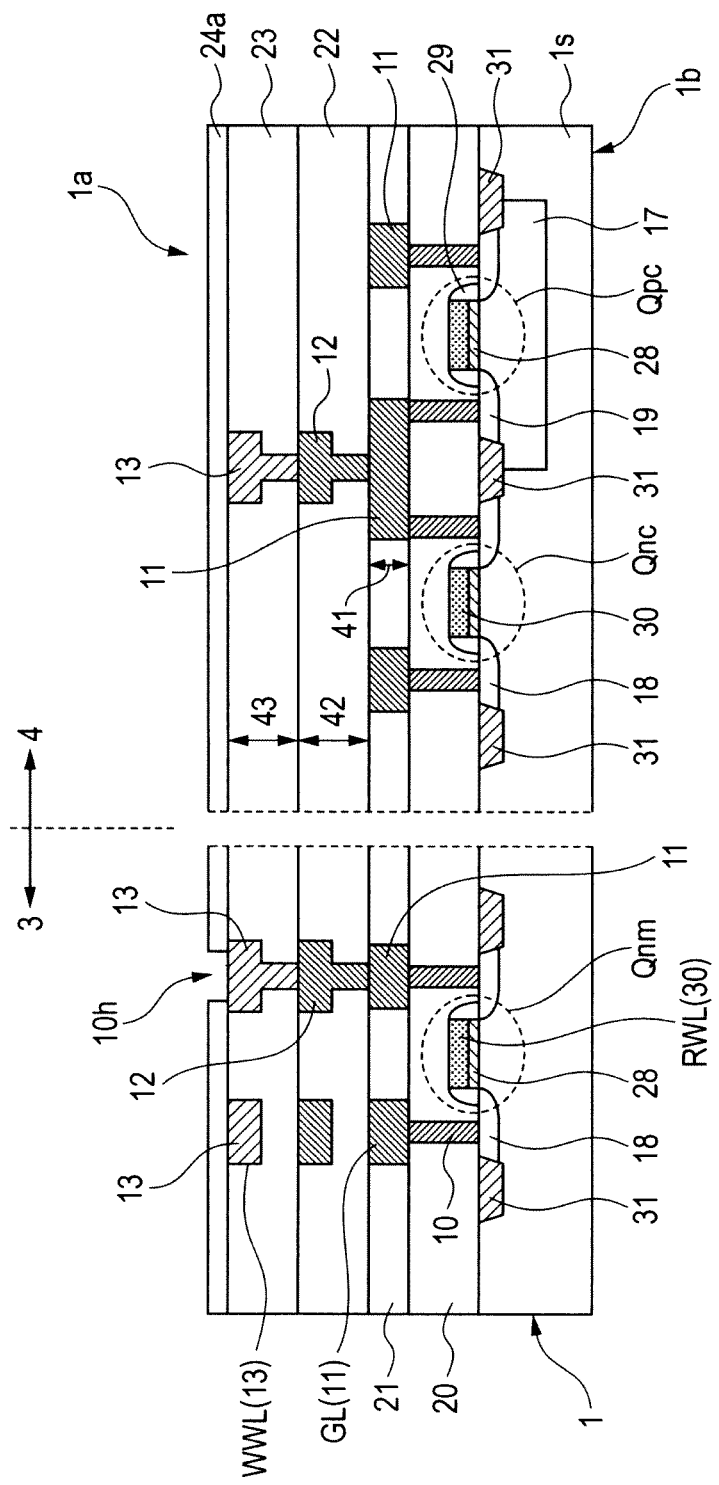
FIG. 13 is a device cross-sectional view during a manufacturing step (step of forming a tungsten plug embedding hole) corresponding to FIG. 5 for describing the outline of the main process in the manufacturing method of a semiconductor device according to the first embodiment of the invention.
Figure 14:
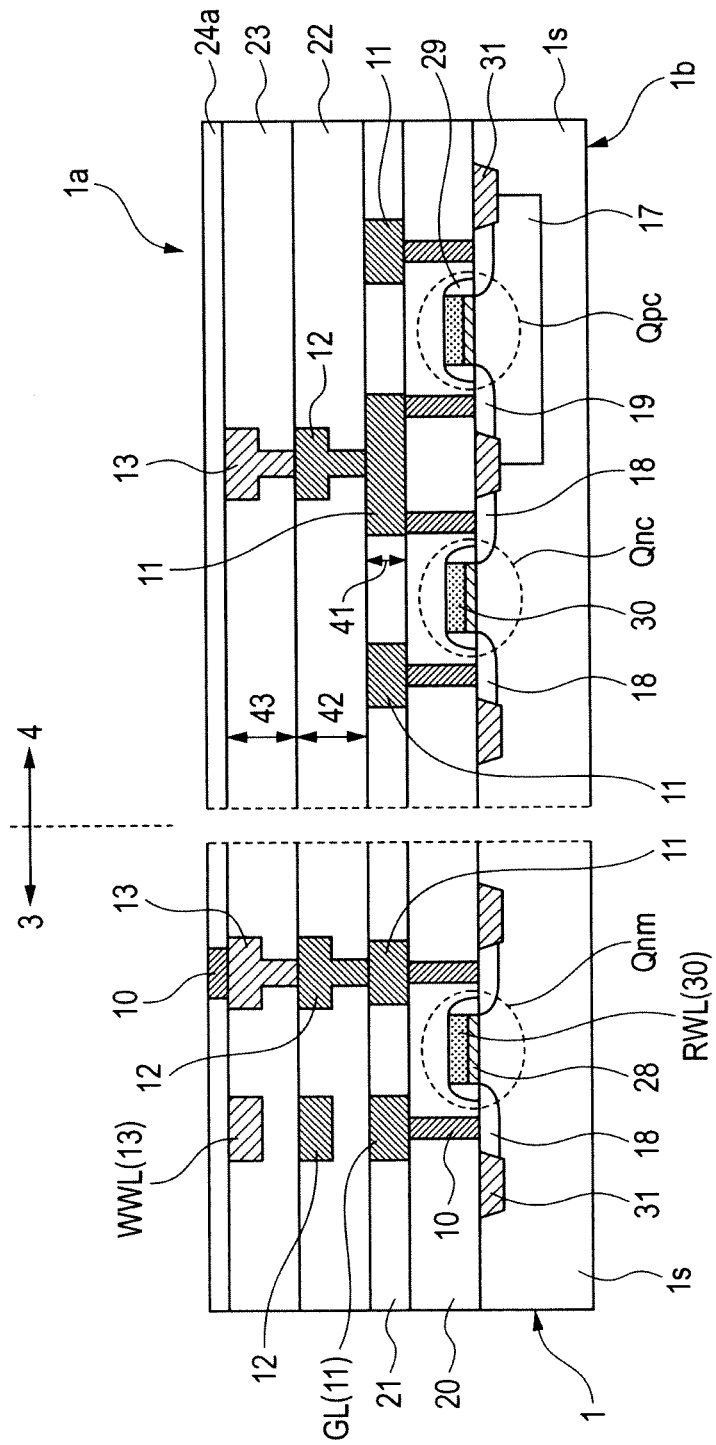
FIG. 14 is a device cross-sectional view during a manufacturing step (step of embedding a tungsten plug) corresponding to FIG. 5 for describing the outline of the main process in the manufacturing method of a semiconductor device according to the first embodiment of the invention.
Figure 15:
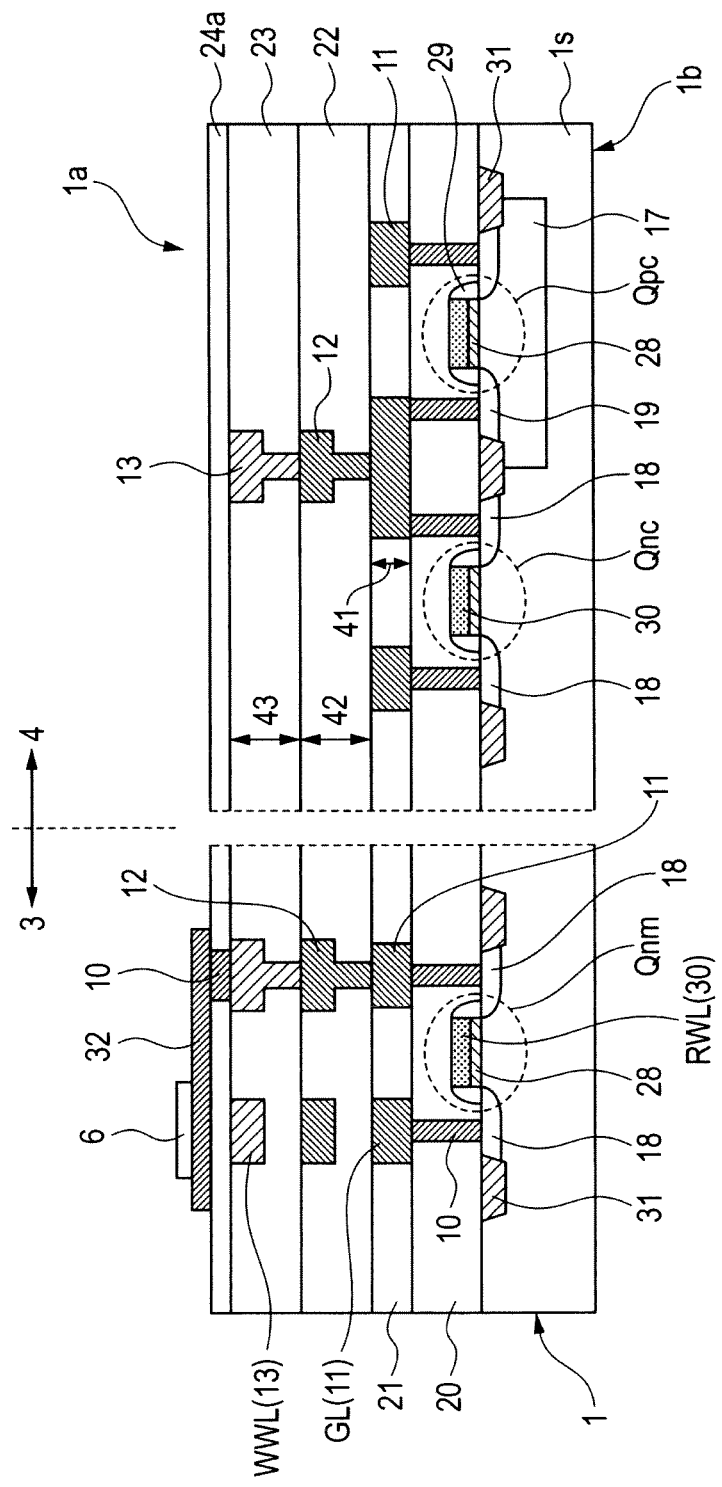
FIG. 15 is a device cross-sectional view during a manufacturing step (step of forming a strap and a magnetic memory element) corresponding to FIG. 5 for describing the outline of the main process in the manufacturing method of a semiconductor device according to the first embodiment of the invention.
Figure 16:
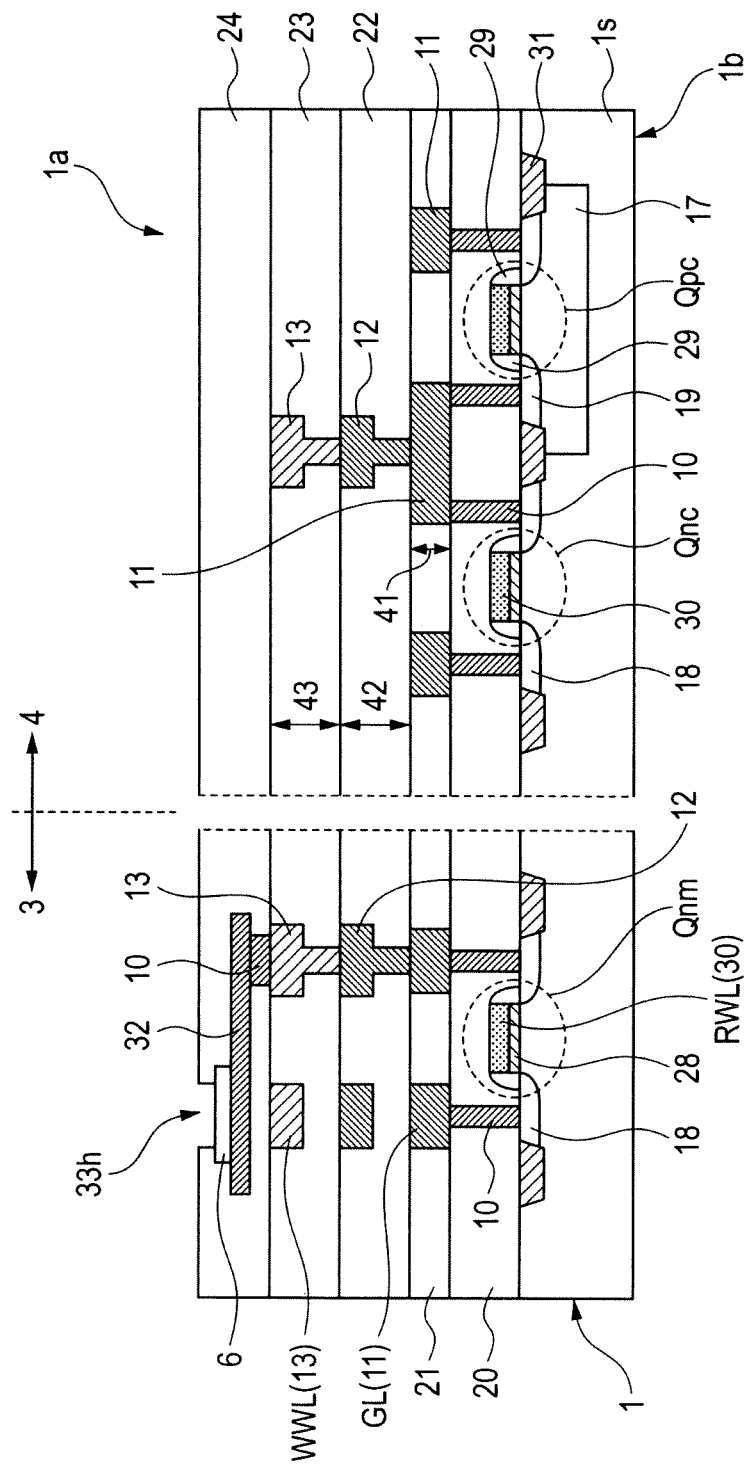
FIG. 16 is a device cross-sectional view during a manufacturing step (step of forming a hole for embedding an upper contact electrode therein) corresponding to FIG. 5 for describing the outline of the main process in the manufacturing method of a semiconductor device according to the first embodiment of the invention.
Figure 17:
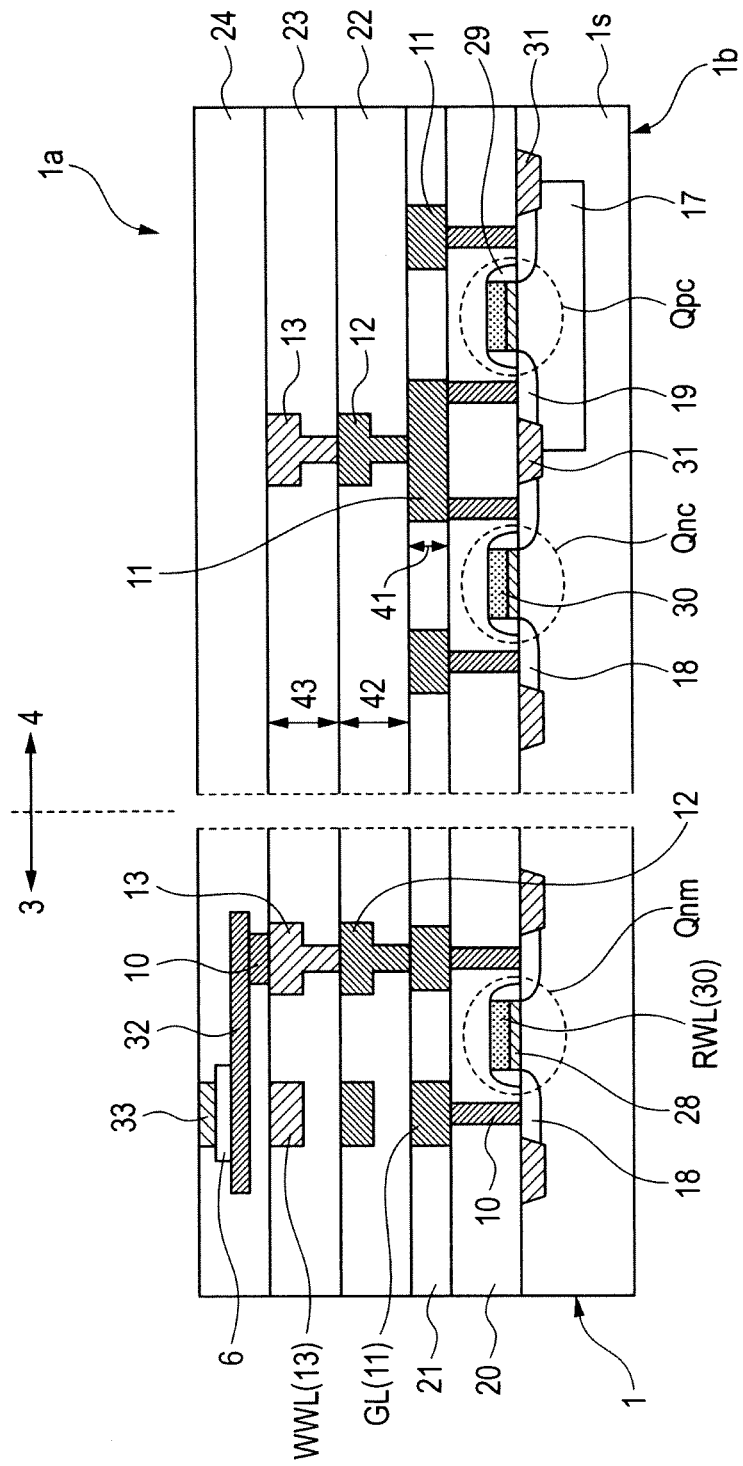
FIG. 17 is a device cross-sectional view during a manufacturing step (step of embedding an upper contact electrode) corresponding to FIG. 5 for describing the outline of the main process in the manufacturing method of a semiconductor device according to the first embodiment of the invention.
Figure 18:
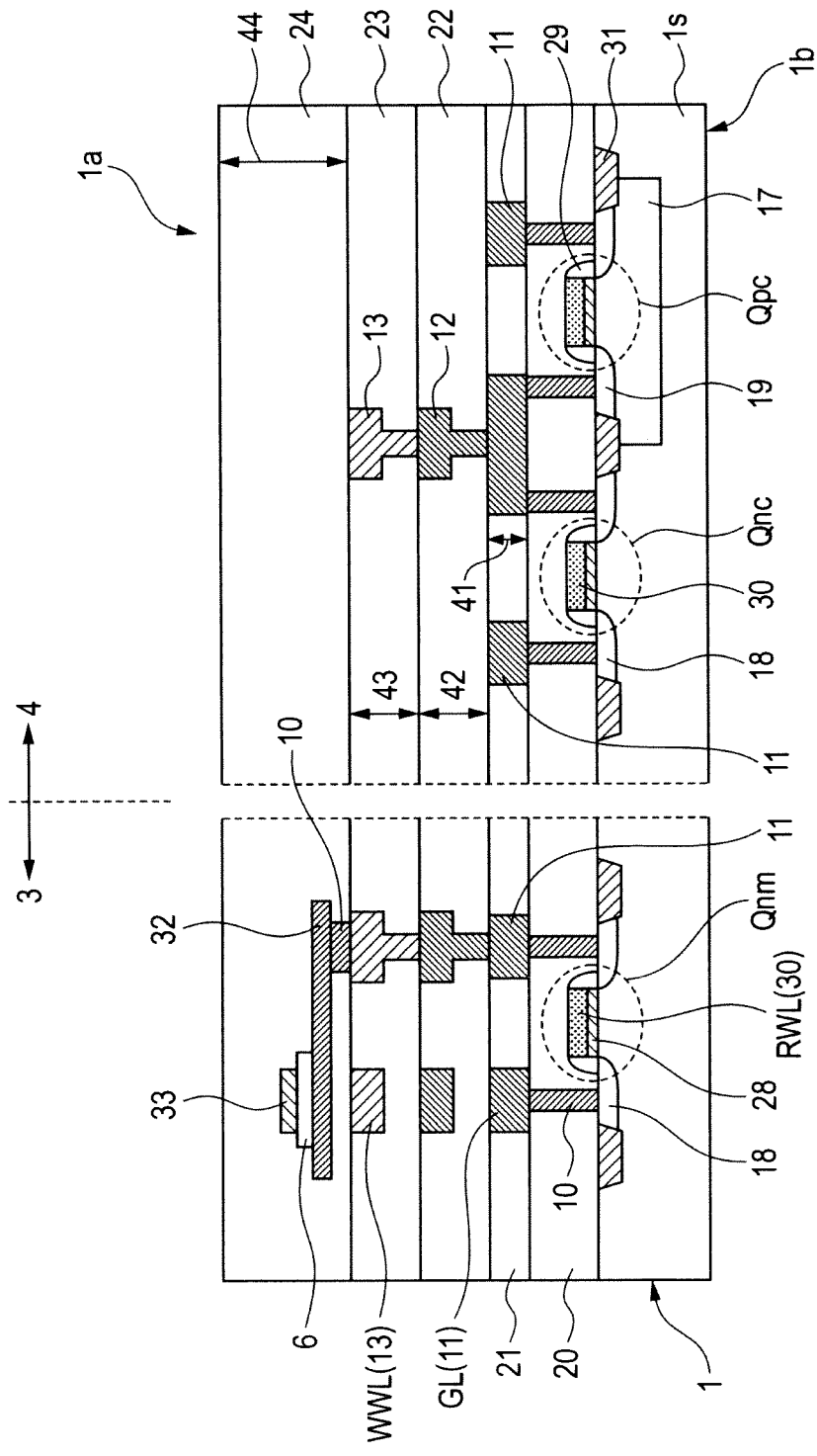
FIG. 18 is a device cross-sectional view during a manufacturing step (step of forming an interlayer insulating film of an M4 wiring layer) corresponding to FIG. 5 for describing the outline of the main process in the manufacturing method of a semiconductor device according to the first embodiment of the invention.
Figure 19:
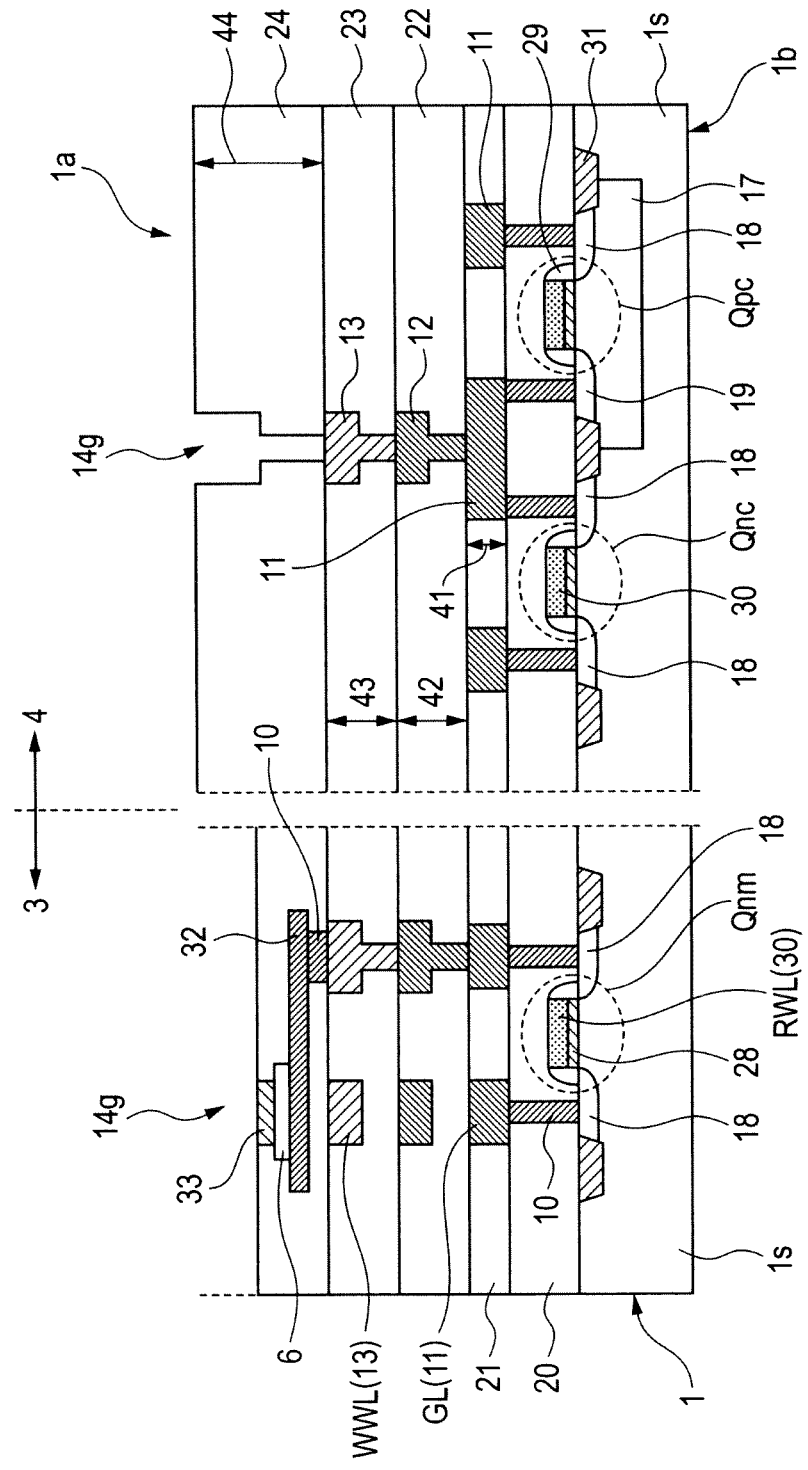
FIG. 19 is a device cross-sectional view during a manufacturing step (step of forming a wiring trench and a via for embedding an M4 wiring therein) corresponding to FIG. 5 for describing the outline of the main process in the manufacturing method of a semiconductor device according to the first embodiment of the invention.
Figure 20:
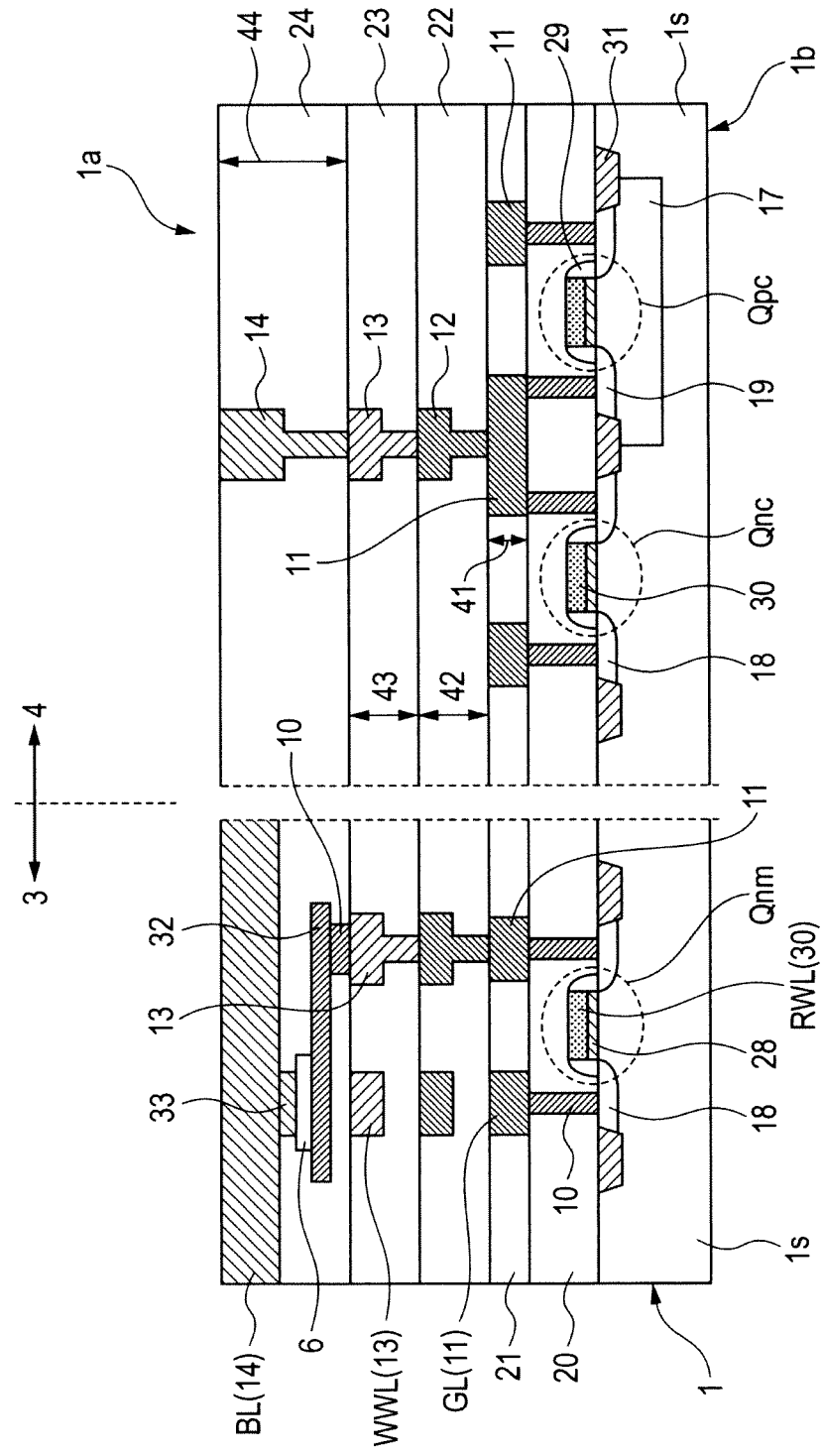
FIG. 20 is a device cross-sectional view during a manufacturing step (step of embedding an M4 wiring) corresponding to FIG. 5 for describing the outline of the main process in the manufacturing method of a semiconductor device according to the first embodiment of the invention.
Figure 21:
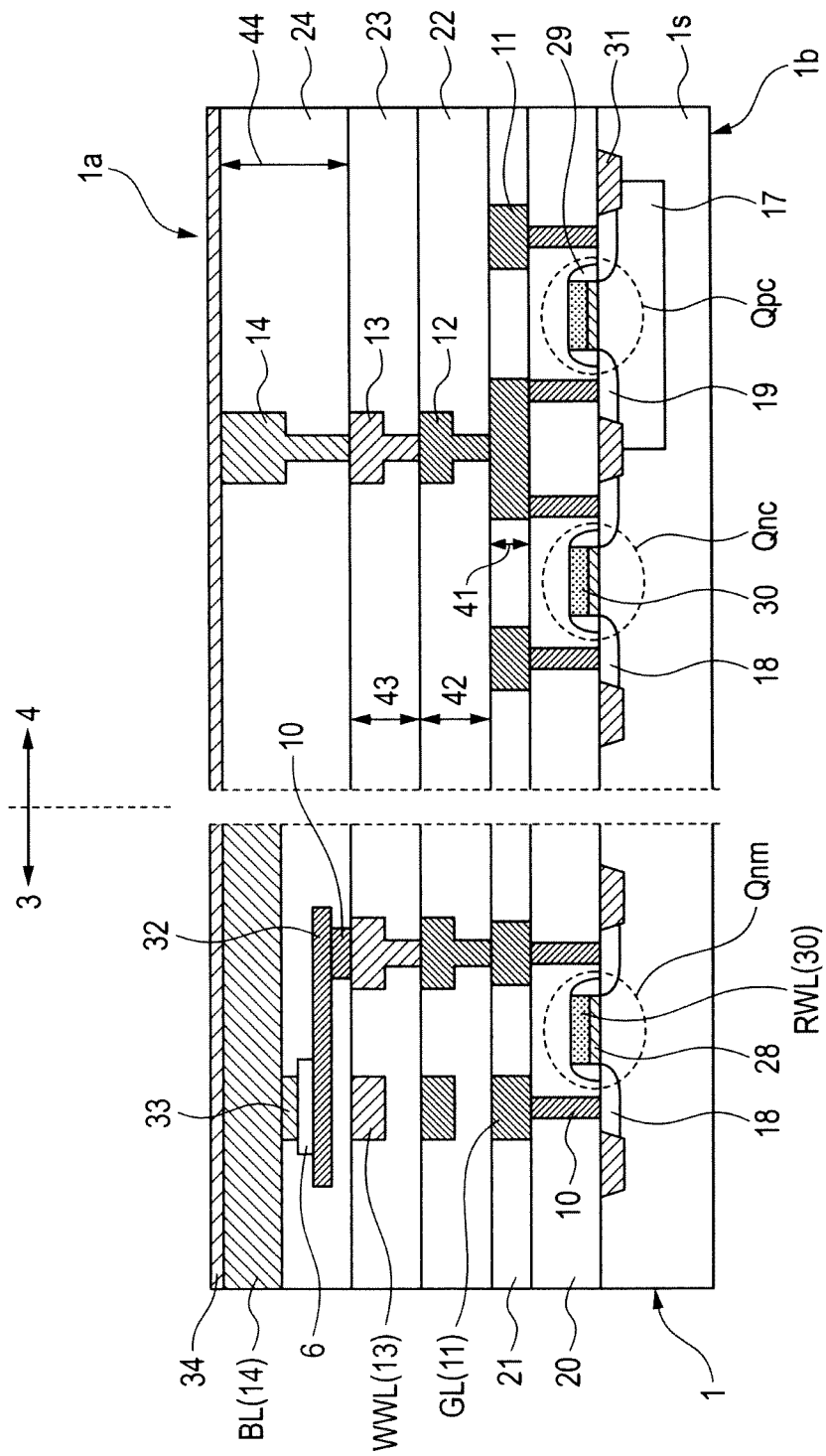
FIG. 21 is a device cross-sectional view during a manufacturing step (step of forming a cap barrier metal film) corresponding to FIG. 5 for describing the outline of the main process in the manufacturing method of a semiconductor device according to the first embodiment of the invention.
Figure 22:
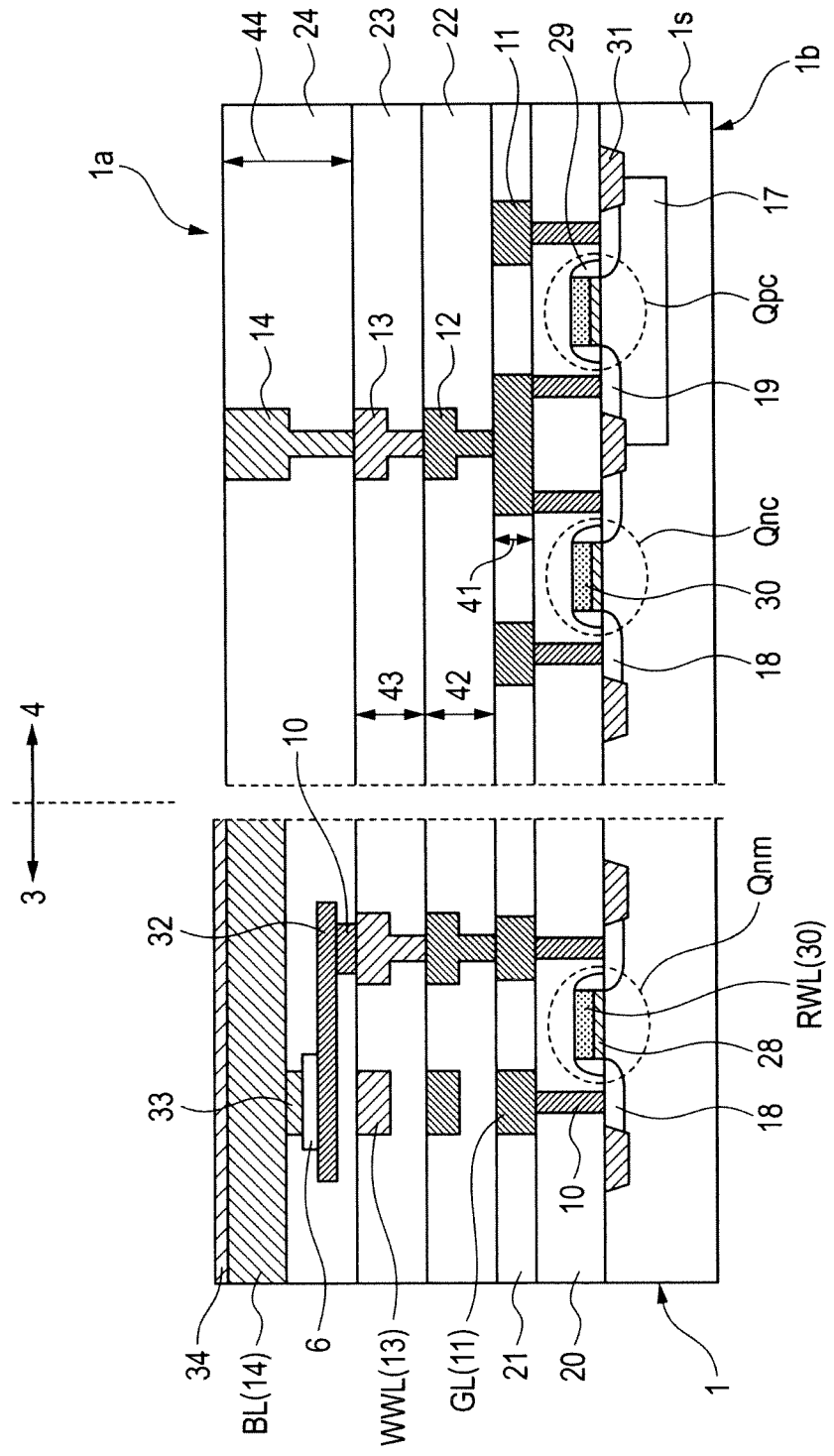
FIG. 22 is a device cross-sectional view during a manufacturing step (step of patterning the cap barrier metal film) corresponding to FIG. 5 for describing the outline of the main process in the manufacturing method of a semiconductor device according to the first embodiment of the invention.

FIG. 9 is a device cross-sectional view during a manufacturing step (step of forming a wiring trench and a via for embedding an M2 wiring therein) corresponding to FIG. 5 for describing the outline of the main process in the manufacturing method of a semiconductor device according to the first embodiment of the invention. FIG. 10 is a device cross-sectional view during a manufacturing step (step of embedding the M2 wiring) corresponding to FIG. 5 for describing the outline of the main process in the manufacturing method of a semiconductor device according to the first embodiment of the invention. FIG. 11 is a device cross-sectional view during a manufacturing step (step of forming a wiring trench and a via for embedding an M3 wiring layer therein) corresponding to FIG. 5 for describing the outline of the main process in the manufacturing method of a semiconductor device according to the first embodiment of the invention. FIG. 12 is a device cross-sectional view during a manufacturing step (step of embedding the M3 wiring) corresponding to FIG. 5 for describing the outline of the main process in the manufacturing method of a semiconductor device according to the first embodiment of the invention. FIG. 13 is a device cross-sectional view during a manufacturing step (step of forming a tungsten plug embedding hole) corresponding to FIG. 5 for describing the outline of the main process in the manufacturing method of a semiconductor device according to the first embodiment of the invention. FIG. 14 is a device cross-sectional view during a manufacturing step (step of embedding a tungsten plug) corresponding to FIG. 5 for describing the outline of the main process in the manufacturing method of a semiconductor device according to the first embodiment of the invention. FIG. 15 is a device cross-sectional view during a manufacturing step (step of forming a strap and a magnetic memory element) corresponding to FIG. 5 for describing the outline of the main process in the manufacturing method of a semiconductor device according to the first embodiment of the invention. FIG. 16 is a device cross-sectional view during a manufacturing step (step of forming a hole for embedding an upper contact electrode therein) corresponding to FIG. 5 for describing the outline of the main process in the manufacturing method of a semiconductor device according to the first embodiment of the invention. FIG. 17 is a device cross-sectional view during a manufacturing step (step of embedding an upper contact electrode) corresponding to FIG. 5 for describing the outline of the main process in the manufacturing method of a semiconductor device according to the first embodiment of the invention. FIG. 18 is a device cross-sectional view during a manufacturing step (step of forming an interlayer insulating film of an M4 wiring layer) corresponding to FIG. 5 for describing the outline of the main process in the manufacturing method of a semiconductor device according to the first embodiment of the invention. FIG. 19 is a device cross-sectional view during a manufacturing step (step of forming a wiring trench and a via for embedding an M4 wiring therein) corresponding to FIG. 5 for describing the outline of the main process in the manufacturing method of a semiconductor device according to the first embodiment of the invention. FIG. 20 is a device cross-sectional view during a manufacturing step (step of embedding the M4 wiring) corresponding to FIG. 5 for describing the outline of the main process in the manufacturing method of a semiconductor device according to the first embodiment of the invention. FIG. 21 is a device cross-sectional view during a manufacturing step (step of forming a cap barrier metal film) corresponding to FIG. 5 for describing the outline of the main process in the manufacturing method of a semiconductor device according to the first embodiment of the invention. FIG. 22 is a device cross-sectional view during a manufacturing step (step of patterning the cap barrier metal film) corresponding to FIG. 5 for describing the outline of the main process in the manufacturing method of a semiconductor device according to the first embodiment of the invention. FIG. 23 is a device cross-sectional view during manufacturing steps (steps subsequent to the step of FIG. 22) corresponding to FIG. 5 for describing the outline of the main process in the manufacturing method of a semiconductor device according to the first embodiment of the invention. Referring to these drawings, the outline of the main process in the manufacturing method of a semiconductor device according to the first embodiment of the invention will be described.

First, as illustrated in FIG. 9, an interlayer insulating film 22 is formed on almost the whole device surface 1a (first main surface) of a wafer 1 by using, for example, CVD (chemical vapor deposition) or the like. Then, a wiring trench 12g (first wiring trench) for embedding an M2 wiring therein is formed using lithography and dry etching in accordance with, for example, the via first process, trench first process, or the like.

Next, as illustrated in FIG. 10, an M2 wiring 12 (first wiring) is then embedded in the wiring trench 12g by film formation treatment such as CVD, sputtering, or plating and planarizing treatment such as CMP (chemical mechanical polishing).

Then, as illustrated in FIG. 11, an interlayer insulating film 23 is formed on almost the whole device surface 1a (first main surface) of the wafer 1, by using, for example, CVD (chemical vapor deposition). Then, a wiring trench 13g (second wiring trench) for embedding an M3 wiring therein is formed using lithography and dry etching in accordance with, for example, the via first process, trench first process, or the like.

Then, as illustrated in FIG. 12, an M3 wiring 13 (second wiring) is embedded in the wiring trench 13g by film formation treatment such as CVD, sputtering, or plating and planarizing treatment such as CMP (chemical mechanical polishing).

Then, as illustrated in FIG. 13, a lower copper-diffusion barrier insulating film 24a such as SiCN is formed on almost the whole device surface 1a (first main surface) of the wafer 1 by using, for example, CVD. Then, lithography and dry etching are conducted to form a hole 10h for embedding a tungsten plug.

Then, as illustrated in FIG. 14, a tungsten plug 10 is embedded by using, for example, CVD or sputtering and planarizing treatment such as CMP.

Then, as illustrated in FIG. 15, a metal film 32 (for example, a TaN film) for metal strap is formed on almost the whole device surface 1a (first main surface) of the wafer 1 by using, for example, CVD or reactive sputtering. Then, plural films as illustrated in FIG. 8 are deposited successively by using, for example, PVD (physical vapor deposition) such as sputtering, followed by lithography and dry etching (if necessary, wet etching may be used in combination) to form a magnetic memory element 6. The metal film 32 for metal strap is then patterned using lithography and dry etching to form a metal strap 32.

Then, as illustrated in FIG. 16, a bottom half portion of an interlayer insulating film 24 is formed on almost the whole device surface 1a (first main surface) of the wafer 1 by using, for example, CVD. Lithography and dry etching are then conducted to form a hole 33h for embedding an upper contact electrode.

Then, as illustrated in FIG. 17, an upper contact electrode 33 is embedded.

Then, as illustrated in FIG. 18, a top half portion of the interlayer insulating film 24 is formed on almost the whole device surface 1a (first main surface) of the wafer 1 by using, for example, CVD.

Then, as illustrated in FIG. 19, a wiring trench 14g (third wiring trench) for embedding an M4 wiring therein is formed using lithography and dry etching in accordance with the via first process, the trench first process, or the like.

Then, as illustrated in FIG. 20, an M4 wiring 14 (third wiring) is embedded in the wiring trench 14g by using film formation treatment such as CVD, sputtering, or plating and planarizing treatment such as CMP.

Then, as illustrated in FIG. 21, a cap barrier metal film 34 is formed on almost the whole device surface 1a (first main surface) of the wafer 1 by using sputtering or the like.

Then, as illustrated in FIG. 22, the cap barrier metal film 34 is patterned using lithography and dry etching.

Then, as illustrated in FIG. 23, an interlayer insulating film 25 is formed on almost the whole device surface 1a (first main surface) of the wafer 1 by using, for example, CVD. An M5 wiring 15 (Al-added non-clad wiring) is then embedded therein in a manner similar to that described above.

Then, an interlayer insulating film 26 is formed on almost the whole device surface 1a (first main surface) of the wafer 1 by using, for example, CVD. An M6 wiring 16 (Al-free non-clad wiring) is then embedded therein in a manner similar to that described above.

Then, an interlayer insulating film 27 below a pad layer is formed on almost the whole device surface 1a (first main surface) of the wafer 1 by using, for example, CVD. A tungsten plug 10 is then embedded therein in a manner similar to that described above.

Then, a metal film 7 for bonding pad is formed on almost the whole device surface 1a (first main surface) of the wafer 1 by using, for example, sputtering. Then, the metal film 7 for bonding pad is patterned using lithography, dry etching or the like to form, for example, an aluminum-based bonding pad 7.

Then, a final passivation film 9 is formed on almost the whole device surface 1a (first main surface) of the wafer 1 by using, for example, CVD (CVD, method of application, etc.).

Lithography, dry etching, and the like are conducted to form a pad opening 8 in the final passivation film 9.

3. Detailed description on the M2 wiring embedding process (FIGS. 9 and 10) and the like in the outline of the main process in the manufacturing method of a semiconductor device according to the first embodiment of the invention.

In this section, a description will be made while focusing on the details of the structure and formation process of the M2 wiring layer 42 (first wiring layer). Although the M1 wiring layer 41 has a single damascene structure and the M2 wiring layer 42 has a dual damascene structure, except for it, they are almost the same in the structure and the manufacturing method so that a detailed description on them is omitted. It is needless to say that the formation process of the M2 wiring layer can almost similarly be applied to the formation process of the M5 wiring layer 45 (FIG. 23). Further, the formation process of the M6 wiring layer 46 (FIG. 23) is almost similar to the below-described one except that a copper seed film is an aluminum-free film.

Figure 24:
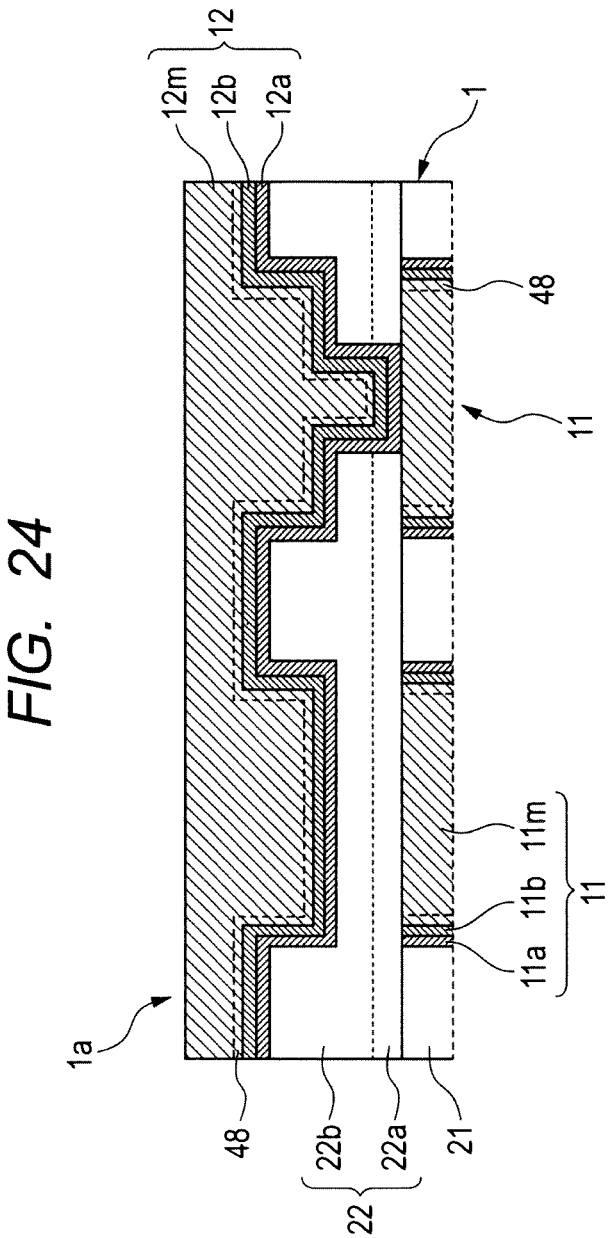
FIG. 24 is an enlarged detailed cross-sectional view (during embedding) of the device corresponding to FIG. 6 for describing the details of the M2 wiring embedding steps (FIGS. 9 and 10) in the outline of the main process in the manufacturing method of a semiconductor device according to the first embodiment of the invention.

FIG. 24 is an enlarged detailed cross-sectional view (during embedding) of the device corresponding to FIG. 6 for describing the details of the M2 wiring embedding steps (FIGS. 9 and 10) in the outline of the main process in the manufacturing method of a semiconductor device according to the first embodiment of the invention. Referring to this drawing, the M2 wiring embedding steps (FIGS. 9 and 10) in the outline of the main process in the manufacturing method of a semiconductor device according to the first embodiment of the invention will next be described in detail.

As illustrated in FIG. 24, when the formation of the M1 wiring layer 41 (FIG. 9) is completed, the interlayer insulating film 21 (second interlayer insulating film) has the M1 wiring 11 (Al-added non-clad wiring) embedded therein. This M1 wiring 11 is comprised of a non-ferromagnetic metal nitride barrier film 11a (for example, a tantalum nitride thin-film), a non-ferromagnetic barrier metal film 11b (for example, a tantalum nitride thin-film), an aluminum-added copper wiring film 11m, and the like in ascending order. The copper wiring film 11m has, at the lower end portion thereof, an aluminum-added (serving as an aluminum source) copper seed film 48.

Then, a relatively thin lower copper-diffusion barrier insulating film 22a (for example, SiCN film) is formed almost on the entire surface of the interlayer insulating film 21 on the device surface 1a of the wafer 1 by using, for example, plasma CVD. Then, a relatively thick upper silicon oxide-based insulating film 22b (compared with the lower copper-diffusion barrier insulating film 22a) is formed on almost the whole surface of the lower copper-diffusion barrier insulating film 22a on the device surface 1a of the wafer 1 by using, for example, plasma CVD or the like. Further, as described in Section 2, a wiring trench and a via are formed to obtain the state as illustrated in FIG. 9. Incidentally, as each of the copper-diffusion barrier insulating films to be used in the invention, in addition to the SiCN film, silicon carbide-based copper-diffusion barrier insulating films such as SiCO film and SiC film and silicon nitride-based copper-diffusion barrier insulating films such as SiN film can be used either as a single layer film or a composite film.

Then, a relatively thin non-ferromagnetic metal nitride barrier film 12a (for example, tantalum nitride thin-film) is formed on almost the whole device surface 1a of the wafer 1 by using, for example, PVD (physical vapor deposition) such as sputtering. Then, a non-ferromagnetic barrier metal film 12b (first barrier metal film) such as tantalum thin-film is formed on almost the whole surface of the non-ferromagnetic metal nitride barrier film 12a on the device surface 1a of the wafer 1 by using, for example, PVD such as sputtering. Then, aluminum is added (an amount of aluminum added upon formation of a seed layer is preferably within a range of, for example, from 0.2 wt. % to 5 wt. % (that is, from 2000 ppmw to 50000 ppmw) to almost the whole surface on the non-ferromagnetic barrier metal film 12b on the device surface 1a of the wafer 1 to form a relatively thin copper seed film 48 (aluminum-added copper seed film). Further, a relatively thick copper film compared with the three underlying films is formed on almost the whole surface of the copper seed film 48 on the device surface 1*a* of the wafer 1 so as to embed the wiring trench and cover almost the whole upper surface of the wafer by using, for example, electroplating. As a result, a copper wiring film 12*m* (first copper wiring film) integrated with the copper seed film 48 (seed portion) is formed. The copper film has a purity, upon electroplating, of for example about 99.99% (pure copper) and contains impurities such as S, O, C, and Cl in a total amount of about several tens ppmw (parts per million weight). At this time, the aluminum content is at least one digit smaller than the impurity content (meaning, several ppmw or less). Heat treatment conducted subsequently (annealing after copper plating) diffuses aluminum of the seed portion over the copper wiring film 12*m*, by which the aluminum concentration of the copper wiring film 12*m* (body portion) except the seed portion becomes, for example, from about 1 ppmw to 50 ppmw. Then, CMP or the like is performed to remove, from outside the wiring trench, a film stack comprised of the non-ferromagnetic metal nitride barrier film 12*a*, the non-ferromagnetic barrier metal film 12*b*, the copper wiring film 12*m*, and the like. As a result, embedding of an M2 wiring 12 (first wiring) is completed as illustrated in FIG. 10.

Thus, in each embodiment of the invention, an aluminum content in the aluminum-added copper wiring film (copper containing an additive element) is higher than the aluminum content in the aluminum-free copper wiring film (pure copper).

4. Detailed description on the M3 wiring embedding process (from FIG. 10 to FIG. 12) in the outline of the main process in the manufacturing method of a semiconductor device according to the first embodiment of the invention (mainly FIGS. 25 and 26).

Figure 25:
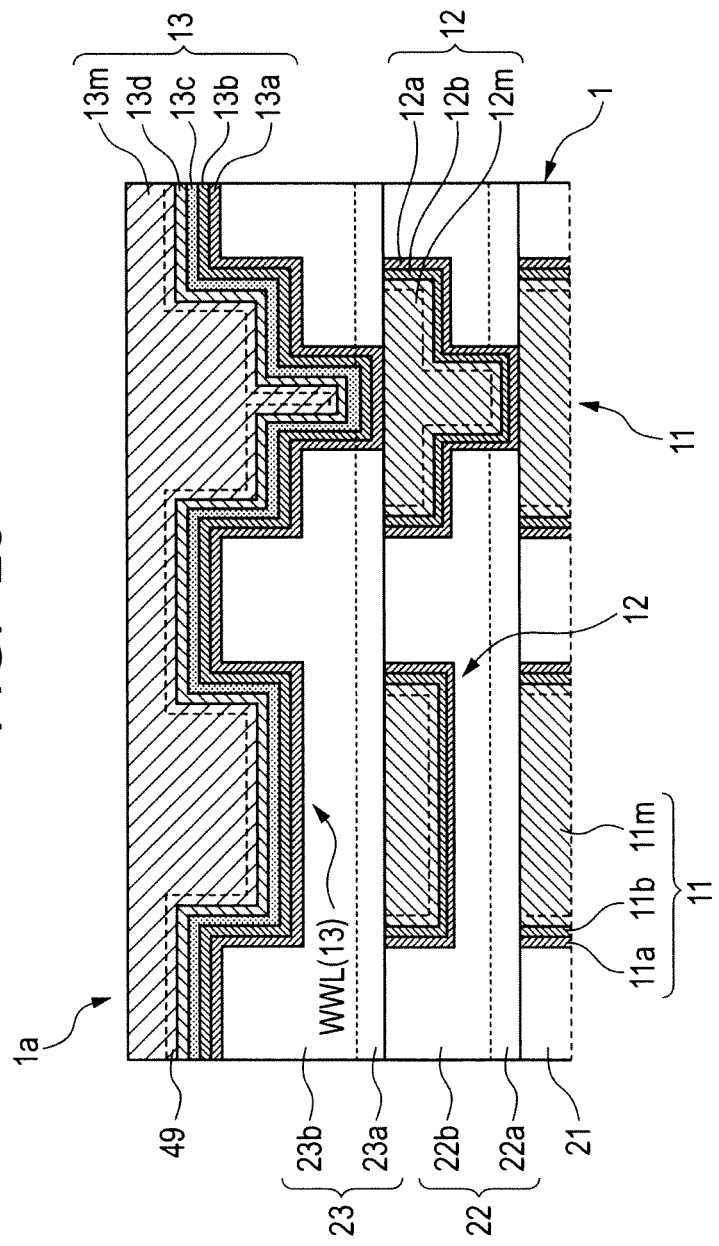
FIG. 25 is an enlarged detailed cross-sectional view (during embedding) of the device corresponding to FIG. 6 for describing the details of the M3 wiring embedding steps (FIGS. 11 and 12) in the outline of the main process in the manufacturing method of a semiconductor device according to the first embodiment of the invention.
Figure 26:
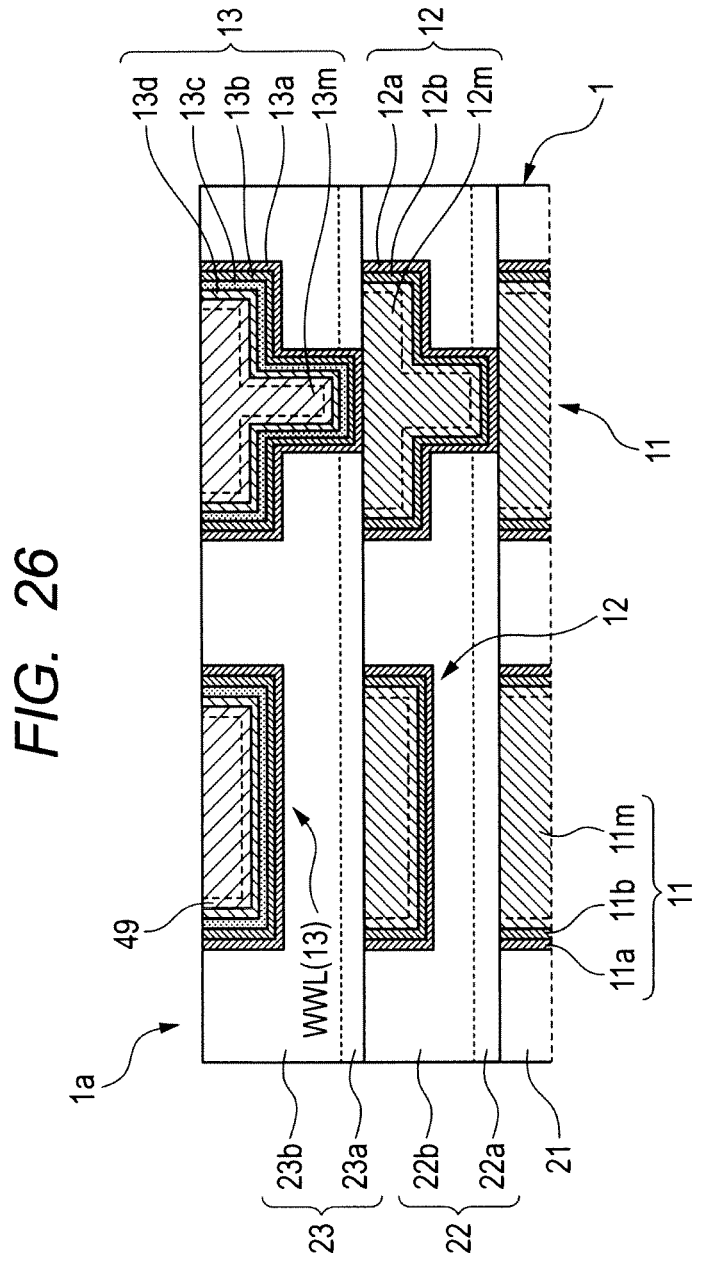
FIG. 26 is an enlarged detailed cross-sectional view (CMP step) of the device corresponding to FIG. 6 for describing the details of the M3 wiring embedding steps (FIGS. 11 and 12) in the outline of the main process in the manufacturing method of a semiconductor device according to the first embodiment of the invention.

FIG. 25 is an enlarged detailed cross-sectional view (during embedding) of the device corresponding to FIG. 6 for describing the details of the M3 wiring embedding steps (FIGS. 11 and 12) in the outline of the main process in the manufacturing method of a semiconductor device according to the first embodiment of the invention. FIG. 26 is an enlarged detailed cross-sectional view (CMP step) of the device corresponding to FIG. 6 for describing the details of the M3 wiring embedding steps (FIGS. 11 and 12) in the outline of the main process in the manufacturing method of a semiconductor device according to the first embodiment of the invention. Referring to these drawings, details of the M3 wiring embedding steps (FIGS. 10 to 12) in the outline of the main process in the manufacturing method of a semiconductor device according to the first embodiment of the invention will be described.

As illustrated in FIG. 25, a relatively thin lower copper-diffusion barrier insulating film 23*a* (for example, an SiCN film) is formed on almost the whole surface of the interlayer insulating film 22 on the device surface 1*a* of the wafer 1, which is in a state of FIG. 10 by using, for example, plasma CVD. Then, a relatively thick upper silicon oxide-based insulating film 23*b* (compared with the lower copper-diffusion barrier insulating film 23*a*) is formed on almost the whole surface of the lower copper-diffusion barrier insulating film 23*a* on the device surface 1*a* of the wafer 1 by using, for example, plasma CVD. Further, as described in Section 2, a wiring trench and a via are formed to provide a state of FIG. 11.

Then, a relatively thin non-ferromagnetic metal nitride barrier film 13*a* (for example, tantalum nitride thin-film) is formed on almost the whole device surface 1*a* of the wafer 1 by using, for example, PVD such as sputtering. Then, a non-ferromagnetic barrier metal film 13*b* (first barrier metal film) such as tantalum thin-film is formed on almost the whole surface of the non-ferromagnetic metal nitride barrier film 13*a* on the device surface 1*a* of the wafer 1 by using, for example, PVD such as sputtering. Then, a permalloy thin film, that is, a ferromagnetic NiFe alloy film is formed, as a ferromagnetic barrier metal film 13*c* (third barrier metal film), on almost the whole surface of the non-ferromagnetic barrier metal film 13*b* on the device surface 1*a* of the wafer 1 by using, for example, PVD such as sputtering. Then, an upper non-ferromagnetic barrier metal film 13*d* (inter-diffusion barrier metal of iron, copper, nickel, and the like, for example, a tantalum thin film) is formed on almost the whole surface of the ferromagnetic barrier metal film 13*c* on the device surface 1*a* of the wafer 1 by using, for example, PVD such as sputtering. Then, a relatively thin aluminum-free (pure copper) copper seed film 49 (aluminum-free copper seed film) is formed on almost the whole surface of the upper non-ferromagnetic barrier metal film 13*d* on the device surface 1*a* of the wafer 1 by using, for example, PVD such as sputtering. Then, a relatively thick copper film, compared with the above-described five-layer underlying film, is formed on almost the whole upper surface of the copper seed film 19 on the device surface 1*a* of the wafer 1 by using, for example, electroplating so as to embed the wiring trench and cover almost the whole upper surface of the wafer. As a result, a copper wiring film 13*m* (second copper wiring film) integrated with the copper seed film 49 (seed portion) is formed.

Then, as illustrated in FIG. 26, CMP or the like is conducted to remove, from outside the wiring trench, the film stack comprised of the non-ferromagnetic metal nitride barrier film 13*a*, the non-ferromagnetic barrier metal film 13*b*, the ferromagnetic barrier metal film 13*c*, the upper non-ferromagnetic barrier metal film 13*d*, the copper wiring film 13*m*, and the like. As a result, embedding of the M3 wiring 13 (second wiring) is completed as illustrated in FIG. 12.

5. Detailed description on the embedding steps (FIGS. 16 and 17) of an upper contact electrode in the memory cell matrix region in the outline of the main process in the manufacturing method of a semiconductor device according to the first embodiment of the invention (mainly FIGS. 27 and 28).

Figure 27:
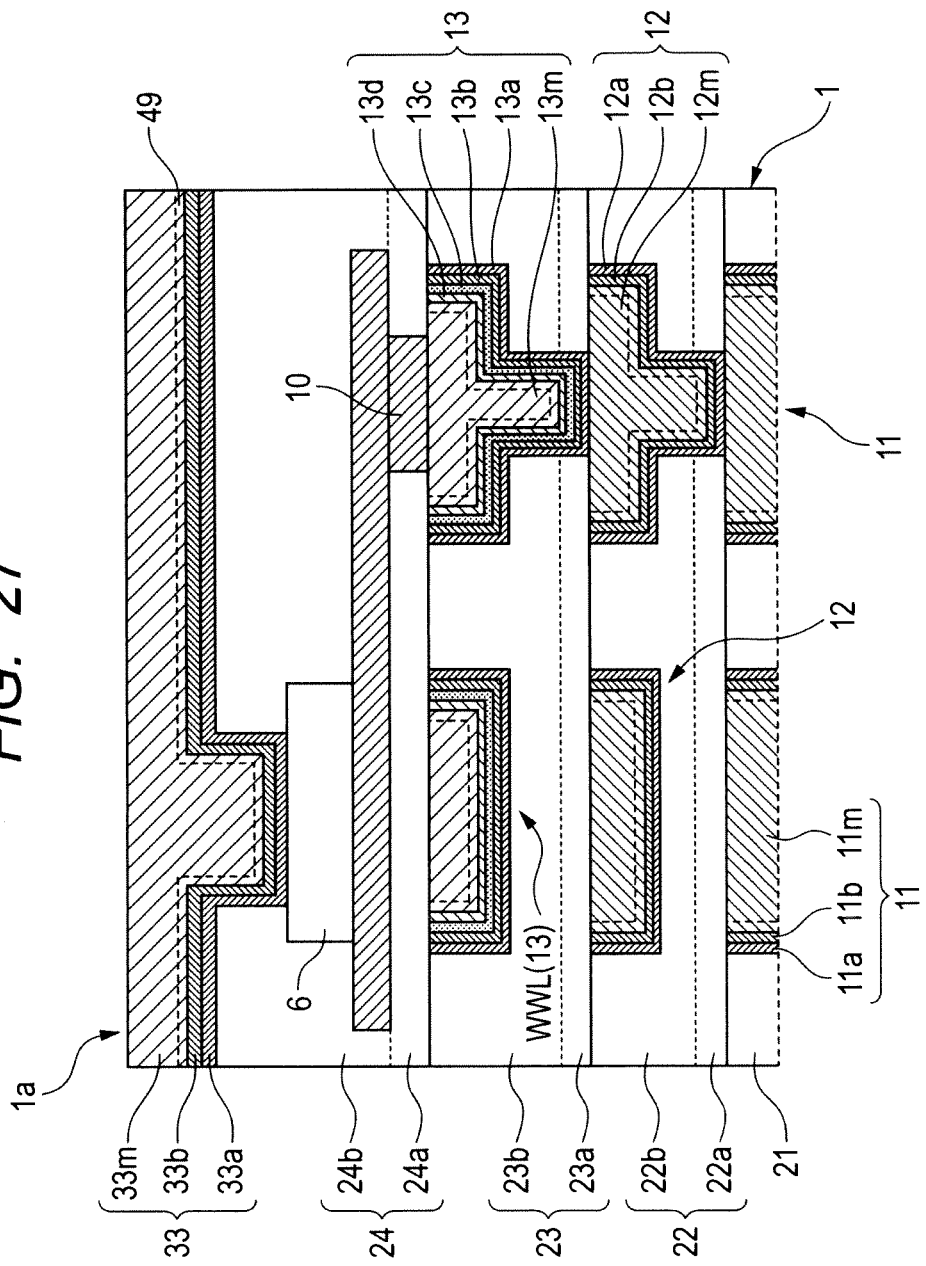
FIG. 27 is an enlarged detailed cross-sectional view (during embedding) of the device corresponding to FIG. 6 for describing the details of the upper contact electrode embedding steps (FIGS. 16 and 17) in the memory cell matrix region in the outline of the main process in the manufacturing method of a semiconductor device according to the first embodiment of the invention.
Figure 28:
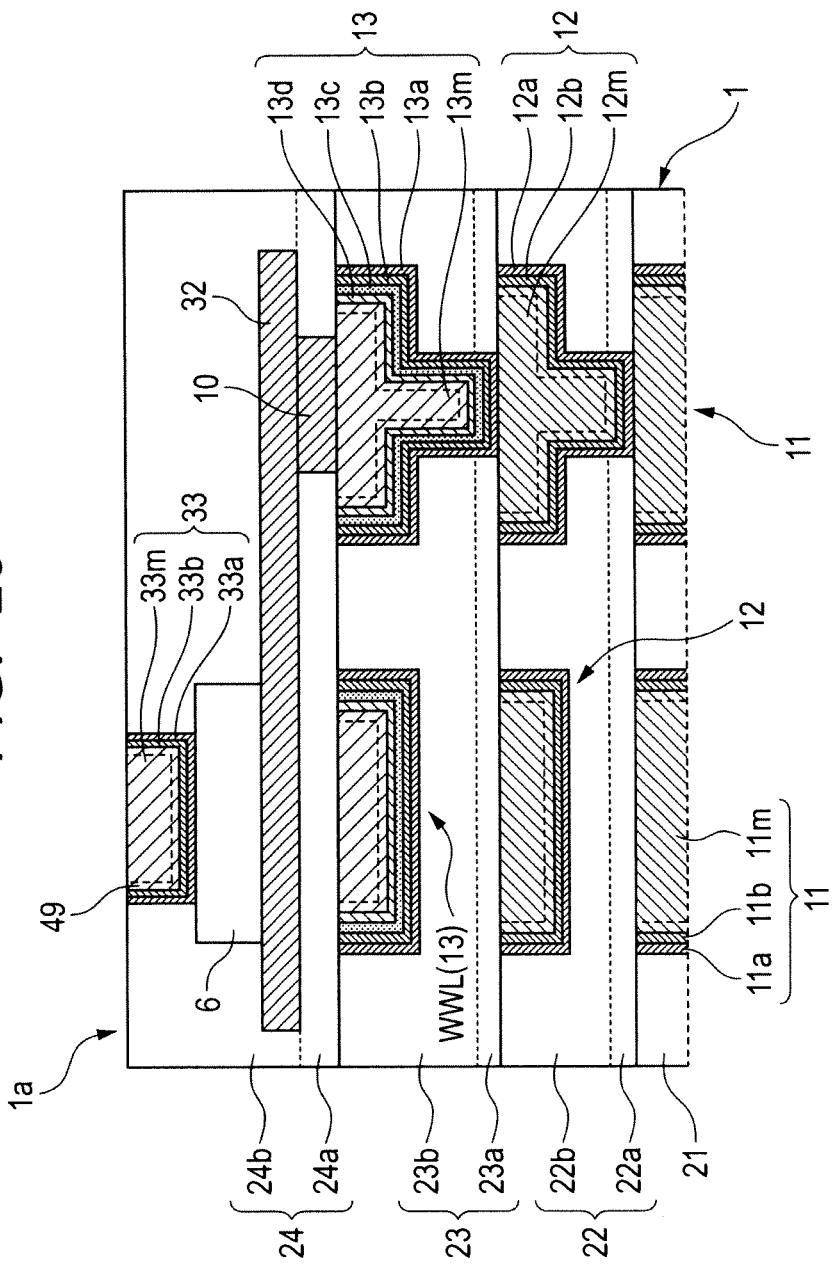
FIG. 28 is an enlarged detailed cross-sectional view (CMP step) of the device corresponding to FIG. 6 for describing the details of the upper contact electrode embedding steps (FIGS. 16 and 17) in the memory cell matrix region in the outline of the main process in the manufacturing method of a semiconductor device according to the first embodiment of the invention.

FIG. 27 is an enlarged detailed cross-sectional view (during embedding) of the device corresponding to FIG. 6 for describing the details of the upper contact electrode embedding steps (FIGS. 16 and 17) in the memory cell matrix region in the outline of the main process in the manufacturing method of a semiconductor device according to the first embodiment of the invention. FIG. 28 is an enlarged detailed cross-sectional view (CMP step) of the device corresponding to FIG. 6 for describing the details of the upper contact electrode embedding steps (FIGS. 16 and 17) in the memory cell matrix region in the outline of the main process in the manufacturing method of a semiconductor device according to the first embodiment of the invention. Referring to these drawings, the upper contact electrode embedding steps (FIGS. 16 and 17) in the memory cell matrix region in the outline of the main process in the manufacturing method of a semiconductor device according to the first embodiment of the invention will be described specifically.

As illustrated in FIG. 27, a relatively thin non-ferromagnetic metal nitride barrier film 33*a* (for example, tantalum nitride thin-film) is formed on almost the whole surface of the interlayer insulating film 24 on the device surface 1*a* of the wafer 1, which is in a state of FIG. 16, by using, for example, PVD such as sputtering. Then, a non-ferromagnetic barrier metal film 33*b* such as tantalum thin-film is formed on almost the whole surface of the non-ferromagnetic metal nitride barrier film 33*a* on the device surface 1*a* of the wafer 1 by using, for example, PVD such as sputtering.

Then, an aluminum-free (that is, pure copper) and relatively thin copper seed film 49 (aluminum-free copper seed film) is formed on almost the whole surface of the non-ferromagnetic barrier metal film 33b such as tantalum thin-film on the device surface 1a of the wafer 1 by using, for example, PVD such as sputtering. Further, a relatively thick copper film, compared with the above-described three-layer underlying film, is formed on almost the whole surface of the copper seed film 49 on the device surface 1a of the wafer 1 by using, for example, electroplating so as to embed the wiring trench and cover almost all the upper surface of the wafer. As a result, a copper wiring film 33m integral with the copper seed film 49 (seed portion) is formed.

Then, as illustrated in FIG. 28, CMP or the like is conducted to remove, from outside the wiring trench, a film stack comprised of the non-ferromagnetic metal nitride barrier film 33a, the non-ferromagnetic barrier metal film 33b, the copper wiring film 33m, and the like to complete embedding of the upper contact electrode 33 as illustrated in FIG. 17.

6. Detailed description on the steps from the embedding of the M4 wiring to the formation of the interlayer insulating film of the M5 wiring layer (FIGS. 19 and 20) in the outline of the main process in the manufacturing method of a semiconductor device according to the first embodiment of the invention (refer to mainly FIGS. 29 and 30 and FIGS. 6 and 7).

Figure 29:
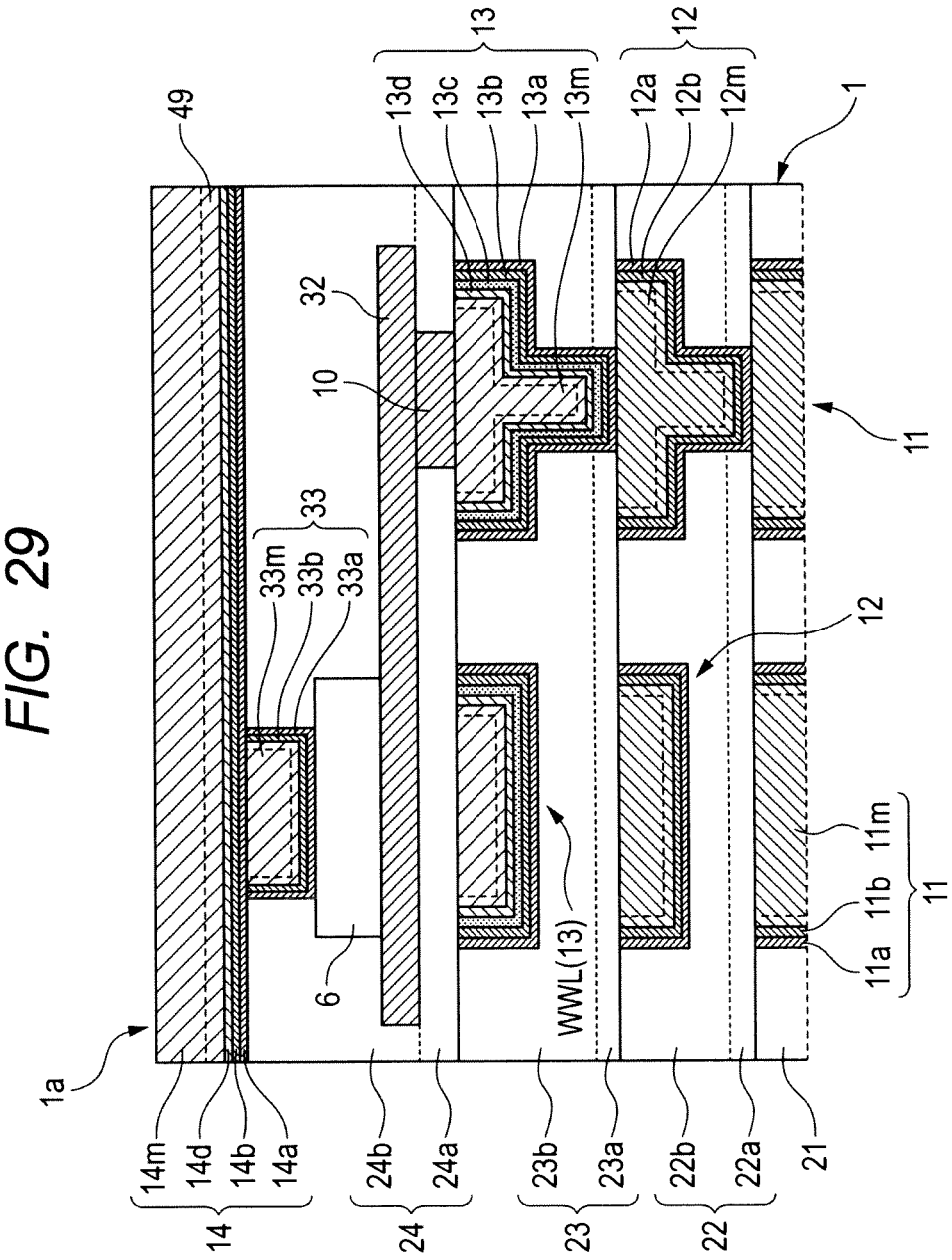
FIG. 29 is an enlarged detailed cross-sectional view of the device (CMP step) corresponding to FIG. 6 for describing the details of the steps from the M4 wiring embedding to the formation of the interlayer insulating film of the M5 wiring layer (FIGS. 19 and 20) in the outline of the main process in the manufacturing method of a semiconductor device according to the first embodiment of the invention.
Figure 30:
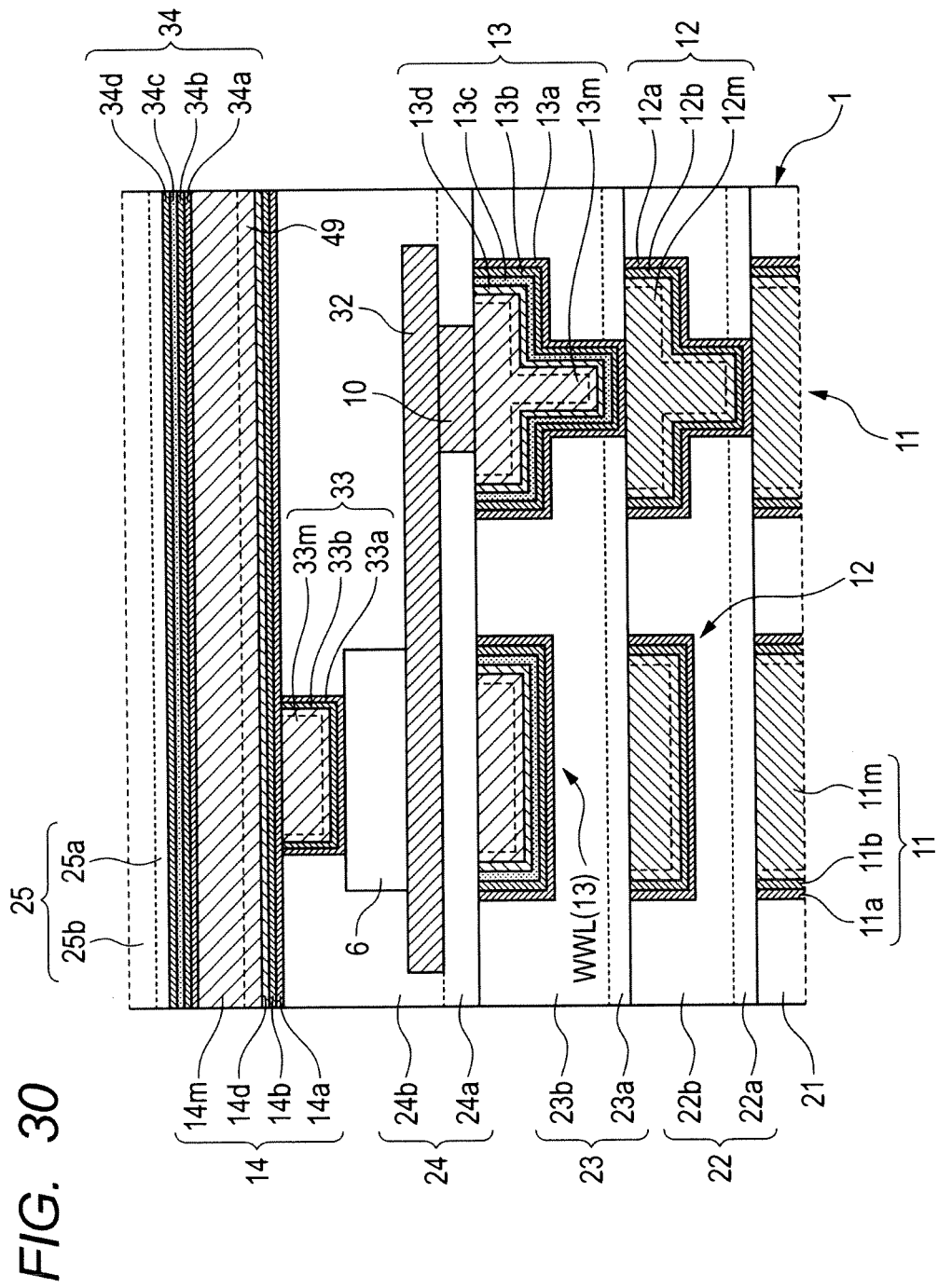
FIG. 30 is an enlarged detailed cross-sectional view of the device (formation of the interlayer insulating film of the M5 wiring layer) corresponding to FIG. 6 for describing the details of the steps from the M4 wiring embedding to the formation of the interlayer insulating film of the M5 wiring layer (FIGS. 19 and 20) in the outline of the main process in the manufacturing method of a semiconductor device according to the first embodiment of the invention.

FIG. 29 is an enlarged detailed cross-sectional view of the device (CMP step) corresponding to FIG. 6 for describing the details of the steps from the M4 wiring embedding to the formation of the interlayer insulating film of the M5 wiring layer (FIGS. 19 and 20) in the outline of the main process in the manufacturing method of a semiconductor device according to the first embodiment of the invention. FIG. 30 is an enlarged detailed cross-sectional view of the device (formation of the interlayer insulating film of the M5 wiring layer) corresponding to FIG. 6 for describing the details of the steps from the M4 wiring embedding to the formation of the interlayer insulating film of the M5 wiring layer (FIGS. 19 and 20) in the outline of the main process in the manufacturing method of a semiconductor device according to the first embodiment of the invention. Referring to these drawings, details of the steps from the embedding of the M4 wiring to the formation of the interlayer insulating film of the M5 wiring layer (FIGS. 9 and 10) in the outline of the main process in the manufacturing method of a semiconductor device according to the first embodiment of the invention will be described.

As illustrated in FIG. 29, a relatively thin non-ferromagnetic metal nitride barrier film 14a (for example, tantalum nitride thin-film) is formed on almost the whole surface of the interlayer insulating film 24 on the device surface 1a of the wafer 1, which is in a state of FIG. 19, by using, for example, PVD such as sputtering. Then, a non-ferromagnetic barrier metal film 14b (fourth barrier metal film) such as tantalum thin-film is formed on almost the whole surface of the non-ferromagnetic metal nitride barrier film 14a on the device surface 1a of the wafer 1 by using, for example, PVD such as sputtering.

Then, a permalloy thin-film, that is, a ferromagnetic NiFe alloy film is formed as a ferromagnetic barrier metal film 14c (fifth barrier metal film) on almost the whole surface of the non-ferromagnetic barrier metal film 14b on the device surface 1a of the wafer 1 by using, for example, PVD such as sputtering (refer to FIGS. 6 and 7). Then, the ferromagnetic barrier metal film 14c is removed from the bottom of the wiring trench by using sputter etching (for example, argon gas sputter etching) or anisotropic dry etching (in other words, removal of the ferromagnetic barrier metal film 14c is conducted while leaving the ferromagnetic barrier metal film 14c on the side walls of the wiring trench). Then, an upper non-ferromagnetic barrier metal film 14d (an inter-diffusion barrier metal of iron, copper, nickel, and the like such as tantalum thin film) is formed on almost the whole surface of the ferromagnetic barrier metal film 14c on the device surface 1a of the wafer 1 by using, for example, PVD such as sputtering. Then, an aluminum-free (meaning, pure copper) and relatively thin copper seed film 49 (aluminum-free copper seed film) is formed on almost the whole surface of the upper non-ferromagnetic barrier metal film 14d on the device surface 1a of the wafer 1 by using, for example, PVD such as sputtering. Further, a relatively thick copper film, compared with the above-described five-layer underlying film, is formed on almost the whole surface of the copper seed film 49 on the device surface 1a of the wafer 1 by using, for example, electroplating so as to embed the wiring trench and cover almost the whole upper surface of the wafer. As a result, a copper wiring film 14m (third copper wiring film) integral with the copper seed film 49 (seed portion) is formed.

CMP or the like is then conducted to remove, from outside the wiring trench, the film stack comprised of the non-ferromagnetic metal nitride barrier film 14a, the non-ferromagnetic barrier metal film 14b, the ferromagnetic barrier metal film 14c, the upper non-ferromagnetic barrier metal film 14d, the copper wiring film 14m, and the like to complete embedding of the M4 wiring 14 (third wiring) as illustrated in FIG. 20.

Then, as illustrated in FIGS. 30 and 21, a relatively thin non-ferromagnetic metal nitride barrier film 34a (for example, a tantalum nitride thin-film) is formed on almost the whole surface of the interlayer insulating film 24 on the device surface 1a of the wafer 1 by using, for example, PVD such as sputtering. Then, a non-ferromagnetic barrier metal film 34b such as tantalum thin film is formed on almost the whole surface of the non-ferromagnetic metal nitride barrier film 34a on the device surface 1a of the wafer 1 by using, for example, PVD such as sputtering. Then, a permalloy thin film, that is, a ferromagnetic NiFe alloy film is formed as a ferromagnetic barrier metal film 34c on almost the whole surface of the non-ferromagnetic barrier metal film 34b on the device surface 1a of the wafer 1 by using, for example, PVD such as sputtering. Then, an upper non-ferromagnetic barrier metal film 34d (diffusion barrier metal of iron, nickel, or the like, for example, a tantalum thin-film) is formed on almost the whole surface of the ferromagnetic barrier metal film 34c on the device surface 1a of the wafer 1, by using, for example, PVD such as sputtering.

Then, as illustrated in FIG. 22, a cap barrier metal film 34 comprised of the non-ferromagnetic metal nitride barrier film 34a, the non-ferromagnetic barrier metal film 34b, the ferromagnetic barrier metal film 34c, the upper non-ferromagnetic barrier metal film 34d, and the like is patterned as described in Section 2.

Then, as illustrated in FIGS. 30 and 23, a lower copper-diffusion barrier insulating film 25a (for example, an SiCN film) and an upper silicon oxide-based insulating film 25b, which are constituents of the interlayer insulating film 25, are formed successively on the M4 wiring layer 44 (third wiring layer) by using, for example, plasma CVD as described in Section 2. The resulting wafer is then treated in a similar manner to that described in Section 2.

7. Description on modification examples of the barrier metal film

In the examples described in Section 1 to Section 6, a description was made while focusing on tantalum-based (Ta/TaN) composite barrier metal films as a configuration of a barrier metal film (mainly, copper-diffusion barrier metal film). Various modifications can be made to them. (1) Example of a single layer of tantalum: When a tantalum-based (Ta/TaN with Ta as an upper layer) composite barrier metal film is replaced with a tantalum-based (Ta) single-layer barrier metal film, the thickness of a copper wiring portion increases so that a reduction in electrical resistance can be expected. (2) Example of a titanium-based barrier: It is also possible to obtain a titanium-based (Ti/TiN with Ti as an upper layer) composite barrier metal film by replacing the tantalum film and tantalum nitride film of the tantalum-based composed barrier metal film with a titanium film and a titanium nitride film, respectively. In a titanium-based (Ti) single-layer barrier metal film, the thickness of the copper wiring portion increases so that reduction in the electrical resistance can be expected as in (1). In the titanium-based barrier, due to good wettability of copper and diffusion of titanium in copper, improvement in EM resistance and SM resistance can be expected. (3) Example of ruthenium single-layer barrier: The barrier metal film may be a ruthenium (Ru)-based single-layer barrier film, a ruthenium alloy single-layer barrier film such as RuTa, or a composite barrier film with another film. These ruthenium-based single-layer or composite barrier films have good wettability of copper so that improvement in EM resistance and SM resistance can be expected. (4) Other copper-diffusion barrier film materials: As a material of a copper-diffusion barrier film, a single layer film or composite film containing at least one of tantalum, titanium, ruthenium, manganese, and tungsten as a main metal component is effective. (5) Materials of a ferromagnetic barrier metal film: As the material of the ferromagnetic barrier metal films 13c, 14c, and 34c, a single layer film of a simple substance of a magnetic metal such as cobalt, nickel or iron or a magnetic alloy (which may be a magnetic alloy other than cobalt, nickel or iron) containing at least one of these magnetic metals as one of the main component; or a composite film containing the single layer film as a main film component can be used.

8. Description on a multi-chip module which is a semiconductor device according to another embodiment of the invention (mainly, FIG. 31).

Figure 31:
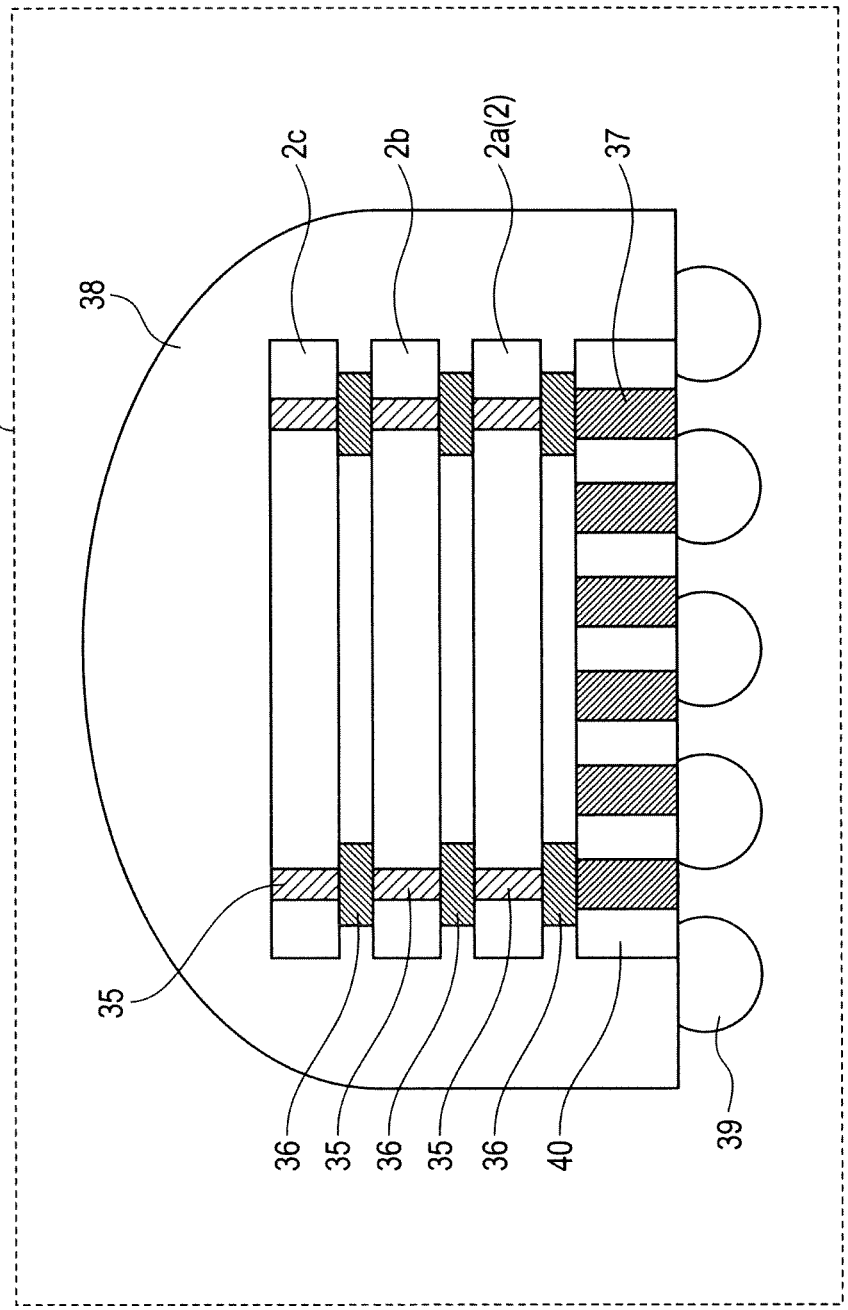
FIG. 31 is a schematic cross-sectional view of the package of a multi-chip module, which is a semiconductor device according to another embodiment of the invention.

The semiconductor chip 2a having an MRAM portion as illustrated in FIG. 1 can be used singly as is or after housed in a package and mounted on a circuit substrate or the like, but as illustrated in FIG. 31, it can be used a multi-chip module after stacking, thereover, other chips 2b and 2c (a chip having an MRAM portion or a chip no having an MRAM portion).

FIG. 31 is a schematic cross-sectional view of the package of the multichip module, which is the semiconductor device according to another embodiment of the invention.

Referring to it, the multi-chip module which is the semiconductor device according to another embodiment of the invention will be described.

The package obtained by stacking various semiconductor chips 2b and 2c over the semiconductor chip 2 (2a) of FIG. 1 is shown in FIG. 31. As illustrated in FIG. 31, a plurality of the chips 2a, 2b, and 2c having a through electrode portion 35 is stacked on a wiring substrate 40 having a through electrode 37 via a substrate-substrate interconnection portion 36 (for example, junction structure of copper electrode/copper-tin junction)/copper electrode). The film stack is, if necessary, sealed with a sealing resin 38 or the like and the sealed body has, on the lower end thereof, a solder bump electrode 39 or the like if necessary.

Each of the chip through electrodes 35 is made of, at the center portion thereof (main portion of the through via electrode), pure copper (similar to the pure copper described above, it is pure copper formed using electroplating and containing normal levels of impurities). The chip through electrode 35 is, different from embedded minute wirings such as damascene copper wirings, a relatively wide via wiring, which does not require consideration of EM resistance, SM resistance, and the like. Accordingly, such a pure-copper through via electrode can provide a through via with low resistance. The chip through electrode 35 is made of a barrier metal film (using, as the material thereof, the above-described tantalum-based (Ta/TaN) barrier and those described in (1) to (4) in the description 7 on the modification examples of the barrier metal film) formed on the side wall and bottom of a trench and the above-described pure copper deposited on the barrier metal to embed in the trench.

9. Supplemental description and consideration of each embodiment:

In specific examples described in Section 1 to Section 8, as wiring layers other than the M3 wiring layer 43 (second wiring layer) and the M4 wiring layer 44 (third wiring layer) which are clad wiring layers, among the M1 wiring layer 41 to the M5 wiring layer 45 which are fine layers and quasi-fine layers, aluminum-added non-clad wiring layers obtained by adding aluminum to a copper wiring film are used to improve EM resistance and SM resistance. In addition, by employing an aluminum-free clad wiring for the M3 wiring layer 43 and the M4 wiring layer 44, which have a clad structure and therefore having relatively high EM resistance and SM resistance (due to good adhesion between copper and a ferromagnetic barrier metal film), an increase in wiring resistance is suppressed. This is because the clad structure is effective for not only accelerating magnetic field concentration caused by a write current but also improving adhesion of copper, thereby improving the reliability of the wiring.

The relatively wide M6 wiring layer 46 (sometimes, M5 wiring layer 45) can usually be provided as an aluminum-free no-clad wiring (effective for prevention of an increase in wiring resistance and reduction of process cost).

With regards to the main configuration of the above embodiments, it is possible to improve the reliability of wirings of lower layers while preventing the speed at a MRAM portion from dropping by properly using wirings, more specifically, by using an aluminum-added non-clad wiring (more generally, element-added non-clad wiring) as at least one wiring layer, whose EM resistance and SM resistance should be considered first, among ultrafine wirings of lower layers and using an aluminum-free clad wiring (more generally, element-free clad wiring) as at least one wiring layer among upper wiring layers with clad wiring.

Preferred examples of the additive element capable of improving properties such as EM resistance and SM resistance include, in addition to aluminum, germanium, gallium, manganese, silicon, titanium, and tin.

10. Summary:

Embodiments of the invention made by the present inventors were described specifically. It should however be borne in mind that the invention is not limited to or by them but can be changed without departing from the scope of the invention.

For example, in the above embodiments, an example of forming an integrated circuit on a silicon single crystal substrate was described specifically. It is needless to say that the integrated circuit may be formed on another semiconductor substrate. In addition, in the above embodiments, the aluminum-based bonding pad was described, but it is needless to say that it may be replaced with a copper-based, titanium-based, gold-based, palladium-based, or another material based pad layer or pad wiring layer. In addition, an example using a tungsten plug (usually, having a titanium barrier film or the like at the periphery thereof) as a fine via coupling wiring was specifically described. It is needless to say that the invention is not limited thereto but another coupling plug is usable. In the above embodiments, a gate first system was exemplified specifically as an MISFET structure. It is needless to say that the invention is not limited to it but can be applied to a gate last system.

What is claimed is:

1. A semiconductor device comprising:
   (a) a semiconductor substrate having a first main surface and a second main surface;
   (b) an MISFET provided over the first main surface of the semiconductor substrate;
   (c) a first interlayer insulating film covering therewith the first main surface of the semiconductor substrate and the MISFET;
   (d) a first wiring layer provided over the first interlayer insulating film;
   (e) a second wiring layer provided over the first wiring layer; and
   (f) a third wiring layer provided over the second wiring layer,
   wherein the first wiring layer comprises:
   (d1) a second interlayer insulating film;
   (d2) a first wiring trench formed in the second interlayer insulating film;
   (d3) a first barrier metal film formed over the side surface and the bottom surface of the first wiring trench and containing at least one of tantalum, titanium, ruthenium, manganese, and tungsten as one of the main metal components of the first barrier metal film; and
   (d4) a first copper wiring film formed over the first barrier metal film to embed the first wiring trench, configuring a first wiring together with the first barrier metal film, and containing an additive element,
   wherein the second wiring layer comprises:
   (e1) a third interlayer insulating film;
   (e2) a second wiring trench formed in the third interlayer insulating film;
   (e3) a second barrier metal film formed over the side surface and the bottom surface of the second wiring trench and containing at least one of tantalum, titanium, ruthenium, manganese, and tungsten as one of the main metal components of the second barrier metal film;
   (e4) a third barrier metal film formed over the second barrier metal film and containing at least one of cobalt, nickel, and iron as one of the main components of the third barrier metal film; and
   (e5) a second copper wiring film formed over the third barrier metal film to embed the second wiring trench, configuring a second wiring together with the second and third barrier metal films, and comprised of pure copper, and
   wherein the third wiring layer comprises:
   (f1) a magnetic memory element.

2. The semiconductor device according to claim 1, wherein the additive element is at least any one of aluminum, germanium, gallium, manganese, silicon, titanium, and tin.

3. The semiconductor device according to claim 2, wherein recording of data in the magnetic memory element is effected by passing an electric current through the second wiring.

4. The semiconductor device according to claim 3, wherein the third wiring layer further comprises:
   (f2) a fourth interlayer insulating film having the magnetic memory element provided therein;
   (f3) a third wiring trench formed in the third interlayer insulating film, located above the magnetic memory element, and extending in a direction perpendicular to the second wiring trench;
   (f4) a fourth barrier metal film formed over the side surface and the bottom surface of the third wiring trench and containing at least one of tantalum, titanium, ruthenium, manganese, and tungsten as one of the main metal components of the fourth barrier metal film;
   (f5) a fifth barrier metal film formed over the fourth barrier metal film and containing at least one of cobalt, nickel, and iron as one of the main components of the fifth barrier metal film; and
   (f6) a third copper wiring film formed over the fifth barrier metal film to embed the third wiring trench, configuring a third wiring together with the fourth and fifth barrier metal films, and comprised of pure copper.

5. The semiconductor device according to claim 4, wherein the magnetic memory element is a magnetic tunnel junction type magnetic memory element.

6. The semiconductor device according to claim 5, wherein the first wiring layer and the second wiring layer have, even in a non-memory cell matrix region outside the memory cell matrix region in which the magnetic memory elements have been arranged in a matrix form, substantially similar structures to the first wiring layer and the second wiring layer in the memory cell matrix region, respectively.

7. The semiconductor device according to claim 6, further comprising:
   (g) a fourth wiring layer formed over the third wiring layer and having a substantially similar structure to the structure of the first wiring layer.

8. The semiconductor device according to claim 7, further comprising:
   (h) a fifth wiring layer formed over the fourth wiring layer and having a substantially similar structure to the structure of the first wiring layer except that the additive element has not been added.

9. The semiconductor device according to claim 1, further comprising:
   (i) a copper through via which penetrates through the semiconductor substrate from the first main surface to the second main surface and is comprised of pure copper.

10. A semiconductor device comprising:
    (a) a semiconductor substrate having a first main surface and a second main surface;
    (b) an MISFET provided over the first main surface of the semiconductor substrate;
    (c) a first interlayer insulating film covering therewith the first main surface of the semiconductor substrate and the MISFET;
    (d) a first wiring layer provided over the first interlayer insulating film;
    (e) a second wiring layer provided over the first wiring layer; and
    (f) a third wiring layer provided over the second wiring layer,
    wherein the first wiring layer comprises:
    (d1) a second interlayer insulating film;
    (d2) a first wiring trench formed in the second interlayer insulating film;
    (d3) a first barrier metal film formed over the side surface and the bottom surface of the first wiring trench and containing at least one of tantalum, titanium, ruthenium, manganese, and tungsten as one of the main metal components of the first barrier metal film; and (d4) a first copper wiring film formed over the first barrier metal film to embed the first wiring trench and configuring a first wiring together with the first barrier metal film, wherein the second wiring layer comprises:

(e1) a third interlayer insulating film;

(e2) a second wiring trench formed in the third interlayer insulating film;

(e3) a second barrier metal film formed over the side surface and the bottom surface of the second wiring trench and containing at least one of tantalum, titanium, ruthenium, manganese, and tungsten as one of the main metal components of the second barrier metal film;

(e4) a third barrier metal film formed over the second barrier metal film and containing at least one of cobalt, nickel, and iron as one of the main components of the third barrier metal film; and (e5) a second copper wiring film formed over the third barrier metal film to embed the second wiring trench and configuring a second wiring together with the second and third barrier metal films, wherein the third wiring layer comprises:

(f1) a magnetic memory element, and wherein the first copper wiring film contains an additive element and the content thereof is higher than the content of the additive element in the second copper wiring film.

11. The semiconductor device according to claim 10, wherein the additive element is at least any one of aluminum, germanium, gallium, manganese, silicon, titanium, and tin.

12. The semiconductor device according to claim 11, wherein recording of data in the magnetic memory element is effected by passing an electric current through the second wiring.

13. The semiconductor device according to claim 12, wherein the third wiring layer further comprises:

(f2) a fourth interlayer insulating film having the magnetic memory element provided therein;

(f3) a third wiring trench formed in the third interlayer insulating film, located above the magnetic memory element and extending in a direction perpendicular to the second wiring trench;

(f4) a fourth barrier metal film formed over the side surface and the bottom surface of the third wiring trench and containing at least one of tantalum, titanium, ruthenium, manganese, and tungsten as one of the main metal components of the fourth barrier metal film;

(f5) a fifth barrier metal film formed over the fourth barrier metal film and containing at least one of cobalt, nickel, and iron as one of the main components of the fifth barrier metal film; and (f6) a third copper wiring film formed over the fifth barrier metal film to embed the third wiring trench, configuring the third wiring together with the fourth and fifth barrier metal films, and comprised of pure copper.

14. The semiconductor device according to claim 13, wherein the magnetic memory element is a magnetic tunnel junction type magnetic memory element.

15. The semiconductor device according to claim 14, wherein the first wiring layer and the second wiring layer have, even in a non-memory cell matrix region outside the memory cell matrix region in which the magnetic memory elements have been arranged in a matrix form, substantially similar structures to the first wiring layer and the second wiring layer in the memory cell matrix region, respectively.

16. The semiconductor device according to claim 15, further comprising:

(g) a fourth wiring layer formed over the third wiring layer and having a substantially similar structure to the structure of the first wiring layer.

17. The semiconductor device according to claim 16, further comprising:

(h) a fifth wiring layer formed over the third wiring layer and having a substantially similar structure to the structure of the first wiring layer except that the additive element has not been added.

18. The semiconductor device according to claim 10, further comprising:

(i) a copper through via which penetrates through the semiconductor substrate from the first main surface to the second main surface and is comprised of pure copper.

19. A method for manufacturing a semiconductor device, comprising the steps of:

forming an MISFET over a first main surface of a semiconductor substrate having the first main surface and a second main surface;

forming a first interlayer insulating film to cover the first main surface of the semiconductor substrate and the MISFET;

forming a first wiring layer over the first interlayer insulating film;

forming a second wiring layer over the first wiring layer; and forming a third wiring layer over the second wiring layer, wherein the first wiring layer comprises:

(d1) a second interlayer insulating film;

(d2) a first wiring trench formed in the second interlayer insulating film;

(d3) a first barrier metal film formed over the side surface and the bottom surface of the first wiring trench and containing at least one of tantalum, titanium, ruthenium, manganese, and tungsten as one of the main metal components of the first barrier metal film; and (d4) a first copper wiring film formed over the first barrier metal film to embed the first wiring trench, configuring a first wiring together with the first barrier metal film, and containing an additive element, wherein the second wiring layer comprises:

(e1) a third interlayer insulating film;

(e2) a second wiring trench formed in the third interlayer insulating film;

(e3) a second barrier metal film formed over the side surface and the bottom surface of the second wiring trench and containing at least one of tantalum, titanium, ruthenium, manganese, and tungsten as one of the main metal components of the second barrier metal film;

(e4) a third barrier metal film formed over the second barrier metal film and containing at least one of cobalt, nickel, and iron as one of the main components of the third barrier metal film; and (e5) a second copper wiring film formed over the third barrier metal film to embed the second wiring trench, configuring the second wiring together with the second and third barrier metal films, and comprised of pure copper, and wherein the third wiring layer comprises:

(f1) a magnetic memory element.

20. A method for manufacturing a semiconductor device, comprising the steps of:

forming an MISFET over a first main surface of a semiconductor substrate having the first main surface and a second main surface;

forming a first interlayer insulating film to cover the first main surface of the semiconductor substrate and the MISFET;

forming a first wiring layer over the first interlayer insulating film;

forming a second wiring layer over the first wiring layer; and forming a third wiring layer over the second wiring layer, wherein the first wiring layer comprises:

(d1) a second interlayer insulating film;

(d2) a first wiring trench formed in the second interlayer insulating film;

(d3) a first barrier metal film formed over the side surface and the bottom surface of the first wiring trench and containing at least one of tantalum, titanium, ruthenium, manganese, and tungsten as one of the main metal components of the first barrier metal film; and (d4) a first copper wiring film formed over the first barrier metal film to embed the first wiring trench and configuring a first wiring together with the first barrier metal film, wherein the second wiring layer comprises:

(e1) a third interlayer insulating film;

(e2) a second wiring trench formed in the third interlayer insulating film;

(e3) a second barrier metal film formed over the side surface and the bottom surface of the second wiring trench and containing at least one of tantalum, titanium, ruthenium, manganese, and tungsten as one of the main metal components of the second barrier metal film;

(e4) a third barrier metal film formed over the second barrier metal film and containing at least one of cobalt, nickel, and iron as one of the main components of the third barrier metal film; and (e5) a second copper wiring film formed over the third barrier metal film to embed the second wiring trench and configuring a second wiring together with the second and third barrier metal films, wherein the third wiring layer comprises:

(f1) a magnetic memory element, and wherein the first copper wiring film contains an additive impurity and the content thereof is greater than the content of the additive impurity in the second copper wiring film.

* * * * *